United States Patent
Goyal

(10) Patent No.: US 8,178,221 B2
(45) Date of Patent: May 15, 2012

(54) {100}<100> OR 45°-ROTATED {100}<100>, SEMICONDUCTOR-BASED, LARGE-AREA, FLEXIBLE, ELECTRONIC DEVICES

(76) Inventor: Amit Goyal, Knoxville, TN (US)

( * ) Notice: Subject to any disclaimer, the term of this patent is extended or adjusted under 35 U.S.C. 154(b) by 909 days.

(21) Appl. No.: 12/011,450

(22) Filed: Jan. 28, 2008

(65) Prior Publication Data

US 2011/0062446 A1  Mar. 17, 2011

Related U.S. Application Data

(63) Continuation-in-part of application No. 11/498,120, filed on Aug. 3, 2006, now Pat. No. 8,119,571, and a continuation-in-part of application No. 11/715,047, filed on Mar. 8, 2007, now Pat. No. 7,906,229, and a continuation-in-part of application No. 10/919,630, filed on Aug. 17, 2004, now Pat. No. 7,510,997, which is a continuation of application No. 09/895,866, filed on Jun. 29, 2001, now Pat. No. 6,784,139.

(60) Provisional application No. 60/217,157, filed on Jul. 10, 2000, provisional application No. 60/704,264, filed on Aug. 1, 2005.

(51) Int. Cl.
*H01L 29/04* (2006.01)
*H01L 31/09* (2006.01)
*B32B 9/00* (2006.01)

(52) U.S. Cl. ........ 428/698; 428/699; 428/701; 428/446; 428/450; 428/472; 505/191; 257/64; 257/E25.009

(58) Field of Classification Search .................. 505/150, 505/191, 235–239, 330; 428/697–702; 257/E33.033, E29.003, E29.004; 427/402, 427/404–405

See application file for complete search history.

(56) References Cited

U.S. PATENT DOCUMENTS

| | | | |
|---|---|---|---|
| 6,555,256 B1* | 4/2003 | Christen et al. | 428/697 |
| 6,645,639 B1* | 11/2003 | Sambasivan et al. | 428/469 |
| 6,784,139 B1* | 8/2004 | Sankar et al. | 505/237 |
| 7,105,118 B2 | 9/2006 | Narayan et al. | |
| 7,208,044 B2* | 4/2007 | Zurbuchen | 117/94 |
| 2004/0003768 A1* | 1/2004 | Goyal | 117/2 |
| 2004/0121191 A1* | 6/2004 | Paranthaman et al. | 428/697 |
| 2004/0266628 A1* | 12/2004 | Lee et al. | 505/238 |
| 2005/0159298 A1* | 7/2005 | Rupich et al. | 502/100 |
| 2006/0008957 A1 | 1/2006 | Kwon et al. | |
| 2006/0115964 A1* | 6/2006 | Findikoglu et al. | 438/509 |
| 2007/0020445 A1 | 1/2007 | Liu et al. | |
| 2007/0044832 A1* | 3/2007 | Fritzemeier | 136/252 |

OTHER PUBLICATIONS

Goyal et al. "Low Cost, Single Crystal-like Substrates for Practical, High Efficiency Solar Cells", Future Generation Photovoltaic Technologies, First NREL Conference, Ed McConnel, The American Institute of Physics, Proceedings, vol. 404, Issue 1, Apr. 1997, p. 377-394.*

* cited by examiner

*Primary Examiner* — Stanley Silverman
*Assistant Examiner* — Kallambella Vijayakumar

(57) ABSTRACT

Novel articles and methods to fabricate the same resulting in flexible, {100}<100> or 45°-rotated {100}<100> oriented, semiconductor-based, electronic devices are disclosed. Potential applications of resulting articles are in areas of photovoltaic devices, flat-panel displays, thermophotovoltaic devices, ferroelectric devices, light emitting diode devices, computer hard disc drive devices, magnetoresistance based devices, photoluminescence based devices, non-volatile memory devices, dielectric devices, thermoelectric devices and quantum dot laser devices.

39 Claims, 27 Drawing Sheets

FIG. 1

| Epitaxial semiconductor device layer – single or multiple, selected from a group comprising of but not limited to those based on indirect bandgap, direct bandgap and multibandgap semiconductors |
|---|
| Optional, epitaxial semiconductor template layer or a graded semiconductor template layer to provide improved lattice matching to device layer |
| Single or multiple buffer layers with atleast the top buffer having a {100}<100> or a 45° rotated, {100}<100> texture |
| Flexible, crystalline, metal or alloy substrate with a primary or secondary recrystallization texture of {100}<100> |

FIG. 3
(A)
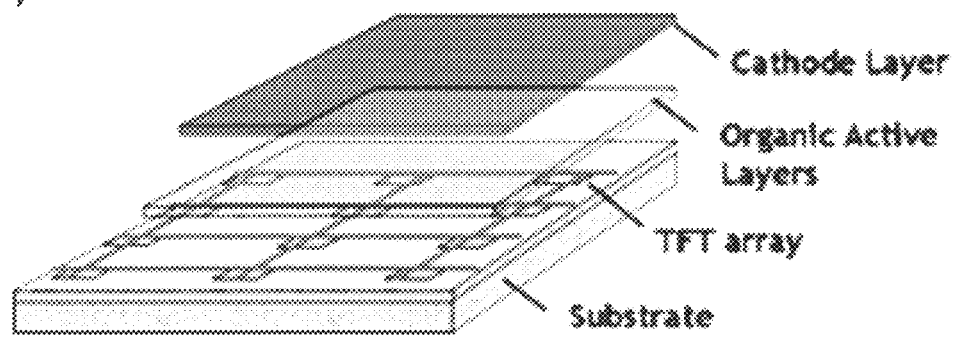
(B)
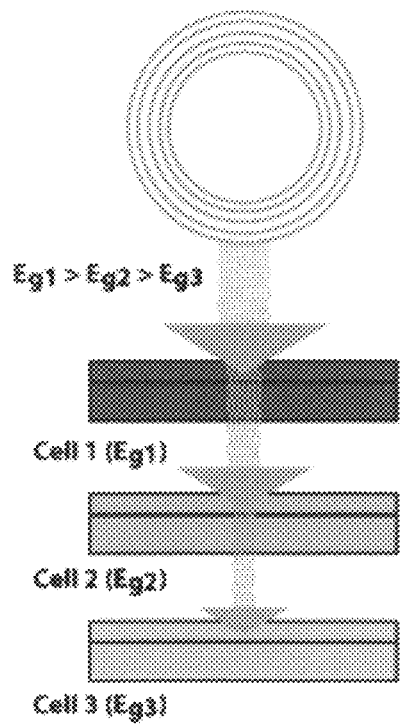

In-plane texture: FWHM = 6.6°
Out-of-plane texture:
FWHM = 3.2° (in rolling direction of NiW)
FWHM = 6.6° (about rolling direction of NiW)

FIG. 13
(A)
Color coded grains
≤ 2 degree
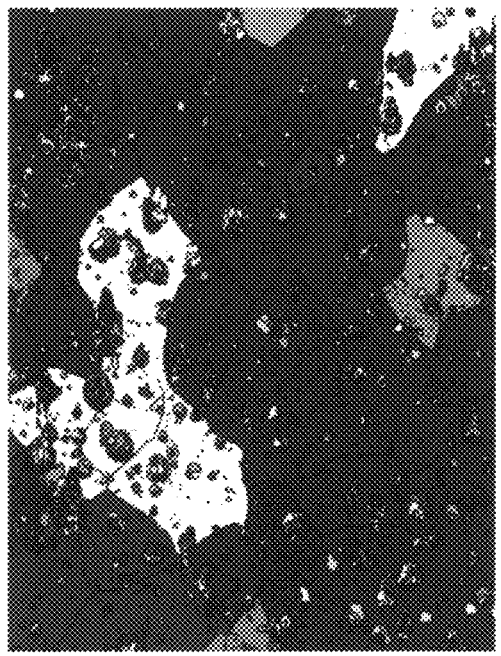
(B)
Color coded grains
≤ 3 degree
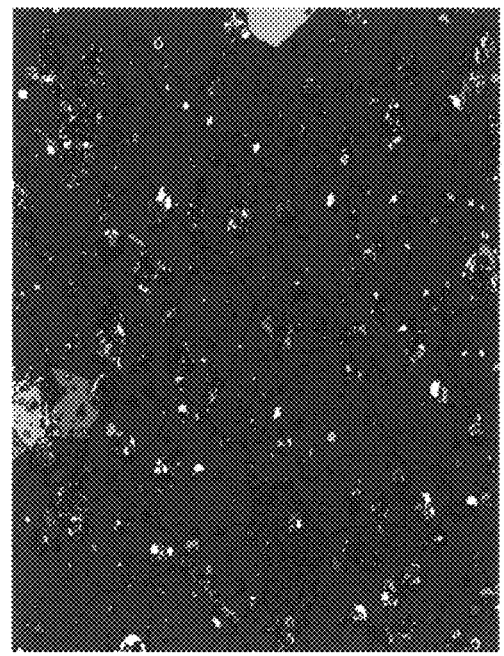

Selected area diffraction pattern from <100> zone axis of a plan view of Si/TiN/NiW, showing alignment of Si{220}, TiN{200} and Ni{200} diffraction spots.

| Epitaxial Si or other semiconductor device or template layer |
|---|
| Epitaxial, TiN layer |
| Flexible, crystalline, {100}<100> textured, metal or alloy substrate |

(B)

| Epitaxial Si or other semiconductor device or template layer |
|---|
| Epitaxial, TiN layer |
| Epitaxial, MgO layer |
| Flexible, {100}<100> textured, metal or alloy substrate |

(C)

| Epitaxial Si or other semiconductor device or template layer |
|---|
| Epitaxial textured, TiN layer |
| Epitaxial textured, YSZ layer |
| Epitaxial $Y_2O_3$ layer |
| Flexible, crystalline, {100}<100> textured, metal or alloy substrate |

(D)

| Epitaxial Si or other semiconductor device or template layer |
|---|
| Epitaxial, TiN layer |
| Epitaxial, MgO layer |
| Epitaxial, YSZ layer |
| Epitaxial, $Y_2O_3$ layer |
| Flexible, {100}<100>, textured, metal or alloy substrate |

FIG. 19
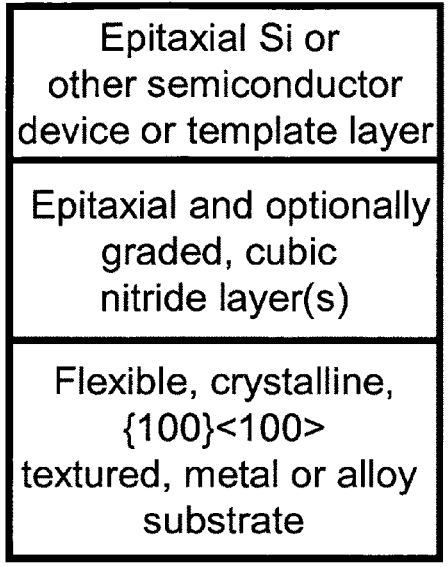
(A)
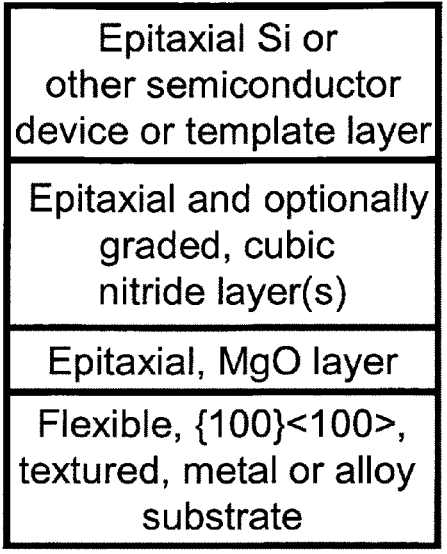
(B)
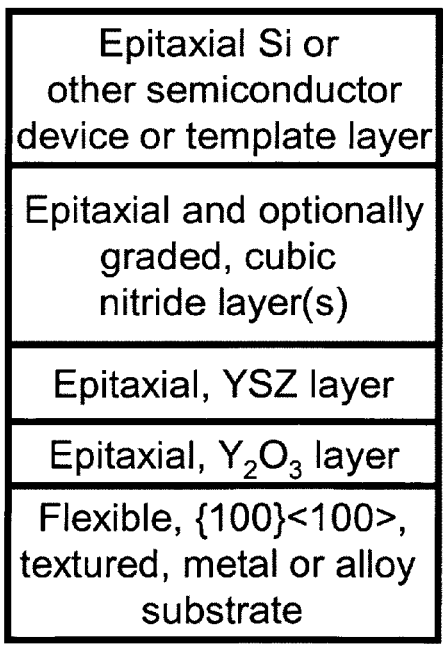
(C)
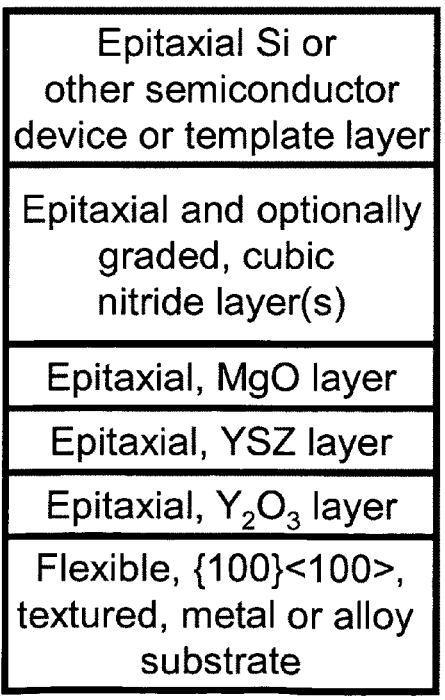
(D)

(A)
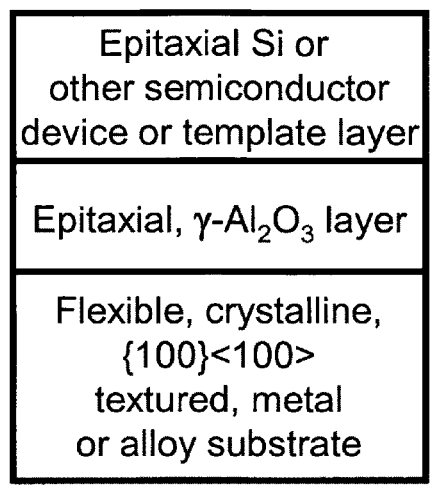
(B) FIG. 20
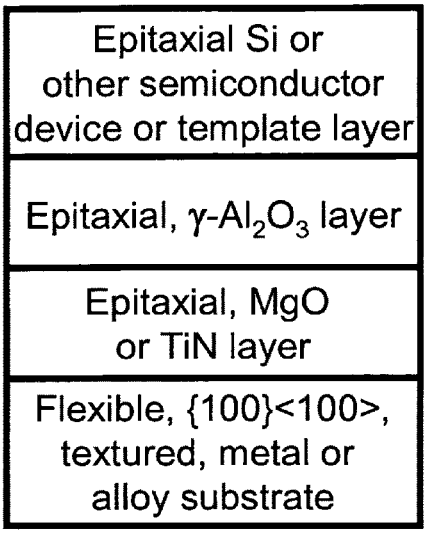
(C)
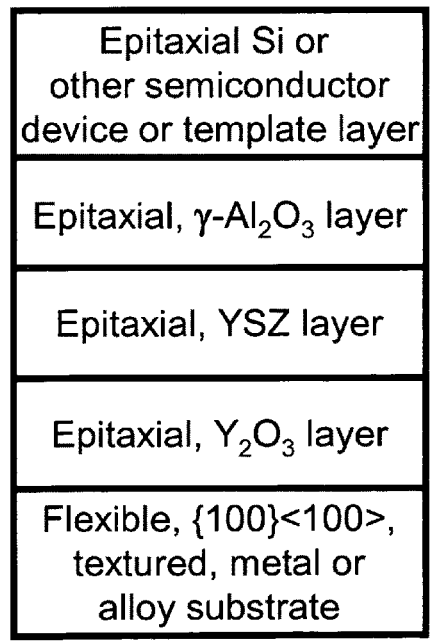
(D)
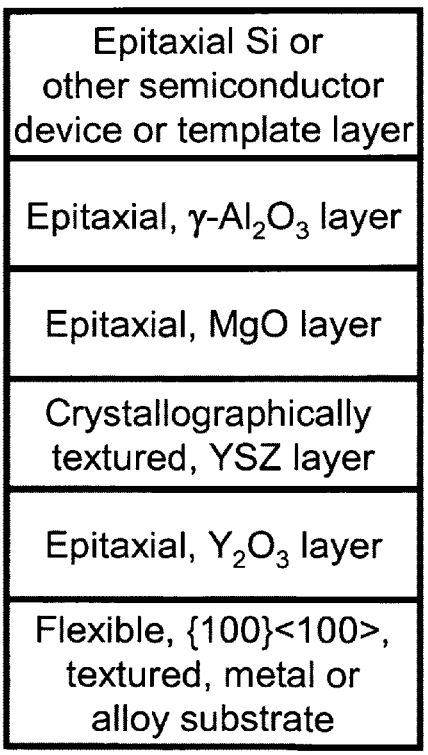

| Epitaxial Si or other semiconductor device or template layer |
| Epitaxial and optionally graded, cubic oxide layer(s) |
| Flexible, crystalline, {100}<100> textured, metal or alloy substrate |

(B)

| Epitaxial Si or other semiconductor device or template layer |
| Epitaxial and optionally graded, cubic oxide layer(s) |
| Epitaxial, MgO layer |
| Flexible, {100}<100>, textured, metal or alloy substrate |

(C)

| Epitaxial Si or other semiconductor device or template layer |
| Epitaxial and optionally graded, cubic oxide layer(s) |
| Epitaxial, YSZ layer |
| Epitaxial, $Y_2O_3$ layer |
| Flexible, {100}<100>, textured, metal or alloy substrate |

(D)

| Epitaxial Si or other semiconductor device or template layer |
| Epitaxial and optionally graded, cubic oxide layer(s) |
| Epitaxial, MgO layer |
| Epitaxial, YSZ layer |
| Epitaxial, $Y_2O_3$ layer |
| Flexible, {100}<100>, textured, metal or alloy substrate |

FIG. 23
(A)
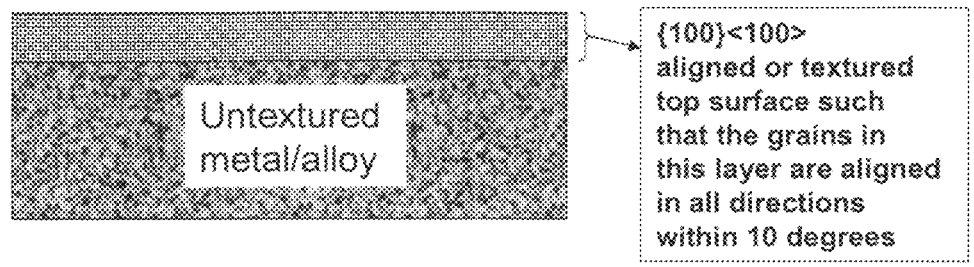
{100}<100>
aligned or textured
top surface such
that the grains in
this layer are aligned
in all directions
within 10 degrees
(B)
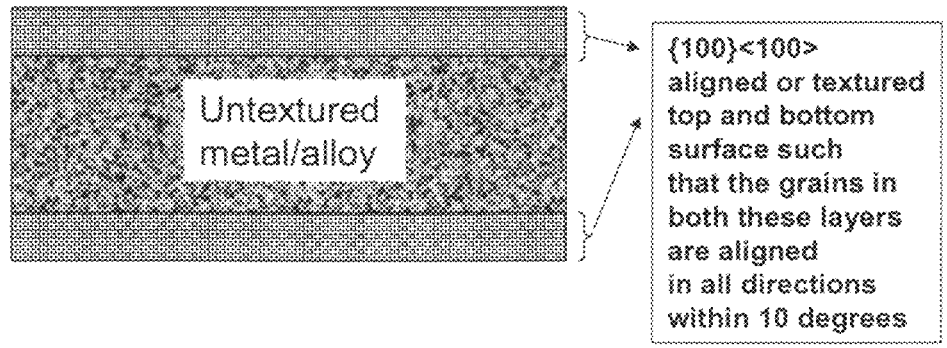
{100}<100>
aligned or textured
top and bottom
surface such
that the grains in
both these layers
are aligned
in all directions
within 10 degrees

{100}<100> OR 45°-ROTATED {100}<100>, SEMICONDUCTOR-BASED, LARGE-AREA, FLEXIBLE, ELECTRONIC DEVICES

CROSS-REFERENCE TO RELATED APPLICATIONS

This application is (1) a continuation-in-part of U.S. patent application Ser. No. 11/498,120 now U.S. Pat. No. 8,119,571 filed on Aug. 3, 2006, which claimed priority to U.S. provisional patent application Ser. No. 60/704,264 filed Aug. 1, 2005, both of which are herein incorporated by reference in entirety and (2) a continuation-in-part of U.S. patent application Ser. No. 11/715,047, filed Mar. 8, 2007 now U.S. Pat. No. 7,906,229, which is also herein incorporated by reference in its entirety and (3) a continuation-in-part of U.S. patent application Ser. No. 10/919,630, filed Aug. 17, 2004 now U.S. Pat. No. 7,510,997, which itself was a continuation of U.S. patent application Ser. No. 09/895,866 filed Jun. 29, 2001 (now U.S. Pat. No. 6,784,139) which claimed priority to U.S. provisional patent application Ser. No. 60/217,157, filed Jul. 10, 2000, both of which are also herein incorporated by reference in entirety

STATEMENT REGARDING FEDERALLY FUNDED RESEARCH OR DEVELOPMENT

This invention was made with Government support under Contract No. DE-AC05-00OR22725 awarded by the United States Department of Energy. The Government has certain rights in this invention.

FIELD OF THE INVENTION

The invention relates to fabrication of high performance electronic devices comprising various types of semiconductors and articles made therefrom.

BACKGROUND OF THE INVENTION

Electronic devices based on semiconductors such as diodes, transistors and integrated circuits can be found everywhere. For many of these applications, if the cost of the device is significantly reduced, many more applications can be envisaged. This is especially true for the photovoltaic or solar energy application, for a whole range of sensors as well as for other application areas such as ferroelectric devices, light emitting diodes for solid state lighting applications, storage applications such as computer hard disc drives, magnetoresistance based devices, photoluminescence based devices, non-volatile memory applications, dielectric devices, thermoelectric devices, The use of renewable energy sources is essential for the future of the world we are living in. There is an unlimited potential for solar energy to power all the world's energy needs. However, for the past two decades, the promise of solar energy has remained unrealized. This is primarily because of the unfavorable price/performance metric of solar cells being manufactured today. Further technological innovations have the potential to cause the economic and commercial breakthrough necessary to lower prices to make solar energy cheaper than or equal to fossil fuels in cost.

Thin-film photovoltaics (PV) have a significant advantage over the traditional wafer-based crystalline Si cells. The primary advantage of thin films is cheaper materials and manufacturing costs and higher manufacturing yields compared to single-crystal technologies. Thin films use 1/20 to 1/100 of the material needed for crystalline Si PV and appear to be amenable to more automated, less expensive production. Currently, three film technologies are receiving significant interest from the industry for large scale PV: amorphous Si, $CuInSe_2$ and CdTe. In most cases, module efficiencies are closely related to cell efficiencies, with minor losses (~10%) due to some loss of active area and some electrical resistance losses. In order to further increase the efficiency and to be able to reproducibly fabricate thin-film based, high efficiency cells, microstructural features which limit the performance need to be controlled. While a complete understanding of the microstructural features which limit the performance are still unclear, it is reasonably well established that recombination at grain boundaries, intragrain defects and impurities is critical. In an effort to minimize the effect of grain boundaries, films with large grains or only low-energy GB's are an objective.

Most thin-film solar cells are based on polycrystalline device layers since the cost of single crystal substrates is prohibitively expensive. Because they are polycrystalline, they do not have a well-defined crystallographic orientation (both out-of-plane and in-plane). Crystallographic orientation can have two important effects. The first is the effect of orientation of the growth surface on incorporation of dopants, intrinsic defects, and other impurities. Previous studies on a wide variety of dopants have shown that variations of 1 to 2 orders of magnitude can occur based on crystallographic orientation. An extreme effect of anisotropic doping is Si doping in GaAs films. Si doping in GaAs films, causes n-type conduction on (111) B-type GaAs, but p-type on (111) A-type GaAs. The second effect of crystallographic orientation is a variation in growth rate of the film being deposited. Both experiments as well as simulations have shown that under certain conditions growth rates can vary by 1 to 2 orders of magnitude as a function of crystallographic orientation. Uncontrolled crystallographic orientation in PV materials with large grain sizes may therefore result in reproducibility problems and hence lower yields during high volume production. Of course, grain boundaries at the intersection of grains in the polycrystalline film act as detrimental, recombination centers.

Most of the microstructural features currently thought to be limiting polycrystalline, thin-film, solar cell performance can be avoided by growing epitaxial films on lattice-matched, single crystal substrates. However, the high costs of single crystal substrates, prohibits their use for realistic applications. The effect of grain boundaries can be circumvented in polycrystalline photovoltaic thin films if the grain sizes are large enough (grain size at which effects on properties are minimal depend among other things on the doping level). However, in thin-films, grain growth is typically restricted to only twice the thickness of the film. Hence, grain boundaries in polycrystalline films have a dominant effect on efficiencies. A large number of studies have reported the effects of grain boundaries on photovoltaic properties.

While much of the discussion above has focused on the solar cell application, there are numerous applications where a low cost, practically scalable method of fabricating single crystal-like semiconductor films is required where the effective size of the single crystal required is about a 100 μm or a few hundred microns in diameter. Furthermore, for certain applications, the semiconductor surfaces/films/wafers need to be flexible, thus enabling applications where a curved semiconductor may be desirable. For example, for a solar cell application it may be desirable to conform the PV module to the contour of a roof upon where it is placed. Thin-film transistors are used for fabricating displays. In this application one can also easily appreciate the use for flexible and large-area displays.

For electronic devices, an ordered array of three dimensional nanodots and nanorods promises to extend device physics to full two- or three-dimensional confinement (quantum wires and dots). Multidimensional confinement in these low dimensional structures has long been predicted to alter significantly the transport and optical properties, compared to bulk or planar heterostructures. More recently, the effect of charge quantization on transport in small semiconductor quantum dots has stimulated much research in single-electron devices, in which the transfer of a single electron is sufficient to control the device. The most important factor driving active research in quantum effect is the rapidly expanding semiconductor band-gap engineering capability provided by modern epitaxy. Possible applications include spin transistors and single electron transistors. Other possible applications of three dimensionally ordered nanodots and nanorods include potential applications in optoelectronics and sensors. For example, an array of luminescent ordered nanodots within a transparent matrix can be used for devices using the photoluminescence effect. Other applications include those in highly efficient photovoltaics, solid-state lighting devices, etc.

SUMMARY OF THE INVENTION

The invention relates to fabrication of large-area, flexible, semiconductor based electronic devices which have high performance. The invention results in semiconductor devices which are crystallographically textured. The invention results in the fabrication of "uniaxially" textured, "biaxially" textured and "triaxially" textured semiconductor device layers. The devices are also "flexible".

"Triaxially textured" as used herein refers to the three crystallographic axis of all grains in a material, all being aligned with respect to one another. The unit cells of all materials can be characterized by three co-ordinate axis, a, b and c. The orientation of an individual grain in a polycrystalline specimen can be defined by the angles made by it's a, b, and c crystallographic axis with the reference specimen co-ordinate system. "Uniaxial texture" refers to alignment of any one of these axis in all the grains comprising the polycrystalline specimen. The "degree of uniaxial texture" can determined using electron backscatter diffraction or by X-ray diffraction. Typically, it is found that the grains have a normal or a Gaussian distribution of orientations with a characteristic bell curve. The full-width-half-maximum (FWHM) of this Gaussian distribution or peak, is the "degree of uniaxial texture" and defines the "sharpness of the texture". The sharpness of texture is also referred to as the "mosaic". Biaxial texture refers to a case wherein two of the three crystallographic axis of all the grains are aligned within a certain degree or sharpness. Triaxial texture refers to a case wherein all three crystallographic axis of all the grains are aligned within a certain degree or sharpness. For example, a triaxial texture characterized by a FWHM of 10°, implies that the independent distribution of orientations of three crystallographic axis, namely a, b and c, of all the grains comprising the material can be described by a distribution whose full-width-half-maximum is 10°.

"Flexible" as used herein refers to the ability to bend the device around a 12 inch mandrel without degradation of device electronic properties.

To achieve the foregoing and other articles, and in accordance with the purposes of the present invention, as embodied and broadly described herein, the present invention provides an electronic device article comprising (a) a flexible, large-grained, crystalline, metal or alloy substrate with a macroscopic, uniaxial texture of [100] or [110], with a sharpness characterized by a full-width-half-maximum (FWHM) of less than 10 degrees, (b) at least one buffer layer on said substrate selected from a group comprising a metal, an alloy, a nitride, boride, oxide, fluoride, carbide, silicide, intermetallic alloy with germanium or combinations thereof, and with the top buffer layer having a macroscopic, uniaxial texture of [100] or [110], with a sharpness characterized by a full-width-half-maximum (FWHM) of less than 10 degrees, and (c) at least one epitaxial layer of an electronic material on said buffer layer, selected from a group comprising of but not limited to those based on indirect bandgap semiconductors such as Si, Ge, GaP; direct bandgap semiconductors such as CdTe, CuInGaSe2 (CIGS), GaAs, AlGaAs, GaInP and AlInP; multiband semiconductors such as II-O-VI materials like Zn1-yMnyOxTe1-x and III-N-V multiband semiconductors such as GaNxAs1-x-yPy, and combinations thereof. This includes minor dopants of other materials in the semiconductor layers for obtaining the required n-type or p-type semiconducting properties.

In a preferred embodiment of the present invention, the said semiconductor layer in the article is a compound semiconductor composed of elements from two or more different groups of the Periodic Table, including compounds of Group III (B, Al, Ga, In) and Group V (N, P, As, Sb, Bi) for the compounds AlN, AlP, AlAs, GaN, GaP, GaAs, InP, InAs, InSb, AlInGaP, AlGaAs, InGaN etc, and the compounds of Group II (Zn, Cd, Hg) and Group VI (O, S, Se, Te) such as ZnS, ZnSe, ZnTe, CdTe, HgTe, CdHgTe etc. In addition to binary compounds of the above, ternary (three elements, e.g. InGaAs) and quaternary (four elements, e.g. InGaAsP) compounds are also are included.

In a preferred embodiment of the present invention, the said semiconductor layer in the article comprises an elemental semiconductor or alloys of elements within the same group such as SiC and SiGe or a compound semiconductor comprising elements of group IB, IIIA and VIA of the periodic table such as alloys of copper, indium, gallium, aluminum, selenium and sulfur.

In a preferred embodiment of the present invention, the textured substrate has a grain size larger than 100 microns.

The semiconductor device article in accordance with this invention can also include at least one buffer layer on said substrate selected from a group comprising a metal, an alloy, a nitride, boride, oxide, fluoride, carbide, silicide or combinations thereof.

In a preferred embodiment of the present invention, the said buffer layer has a crystal structure selected from a group comprising of rock-salt crystal structures of formula AN or AO, where A is a metal and N and O correspond to nitrogen and oxygen; perovskite crystal structures of formula $ABO_3$, where A and B are metals and O is oxygen; pyrochlore crystal structures of formula $A_2B_2O_7$, where A and B are metals and O is oxygen and bixbyite crystal structures of formula $A_2O_3$, where A is a metal and O is oxygen.

In a preferred embodiment of the present invention, the said buffer layer has a chemical formula selected from a group comprising of a mixed rock-salt crystal structures with the formula of $A_xB_{1-x}O$ and $A_xB_{1-x}N$, where A and B are different metals; mixed oxynitrides such as $A_xB_{1-x}N_yO_{1-y}$, where A and B are different metals; mixed bixbyite structures such as $(A_xB_{1-x})_2O_3$, where A and B are different metals; mixed perovskites such as $(A_xA'_{1-x})BO_3$, $(A_xA'_{1-x})(B_yB'_{1-y})O_3$, where A, A', B and B' are different metals and mixed pyrochlores such as $(A_xA'_{1-x})_2B_2O_7$, $(A_xA'_{1-x})_2(B_yB'_{1-y})_2O_7$, where A, A', B and B' are different metals.

In yet another preferred embodiment of the present invention, the buffer layer can be an oxide buffer layer selected from a group comprising gamma $Al_2O_3$ (cubic form of $Al_2O_3$); perovskites such as but not limited to $SrTiO_3$, $(Sr, Nb)TiO_3$, $BaTiO_3$, $(Ba,Ca)TiO_3$, $LaMnO_3$, $LaAlO_3$, doped perovskites such as $(La,Sr)MnO_3$, $(La, Ca)MnO_3$; layered perovskites such as $Bi_4Ti_3O_{12}$; pyrochlores such as but not limited to $La_2Zr_2O_7$, $Ca_2Zr_2O_7$, $Gd_2Zr_2O_7$; flourites such as $Y_2O_3$, YSZ; rock-salt oxides such as but not limited to MgO; spinels such as but not limited to $MgAl_2O_4$, In another preferred embodiment, the buffer stack comprising the electronic device is selected from buffer-layer configurations selected from a group comprising a cubic nitride layer, a multilayer of MgO/cubic nitride, a multilayer of $Y_2O_3$/YSZ/cubic nitride, a multilayer of $Y_2O_3$/YSZ/MgO/cubic nitride, a cubic oxide layer, a multilayer of MgO/cubic oxide, a multilayer of $Y_2O_3$/YSZ/cubic oxide and a multilayer of $Y_2O_3$/YSZ/MgO/cubic oxide.

In another preferred embodiment, the buffer stack comprising the electronic device is selected from buffer-layer configurations selected from a group comprising a TiN layer, a multilayer of MgO/TiN, a multilayer of $Y_2O_3$/YSZ/TiN, a multilayer of $Y_2O_3$/YSZ/MgO/TiN, a cubic oxide layer, a multilayer of MgO/$\gamma$-$Al_2O_3$, a multilayer of $Y_2O_3$/YSZ/$\gamma$-$Al_2O_3$ and a multilayer of $Y_2O_3$/YSZ/MgO/$\gamma$-$Al_2O_3$.

The buffer layer can be a silicide buffer layer or an intermetallic alloy with germanium corresponding to a layer with a chemical formula, MSi or $MSi_2$, $MSi_3$, MGe or $MGe_2$, $MGe_3$, wherein M is a metal such as but not limited to Ni, Cu, Fe, Ir, and Co.

The buffer layer can also be a carbide layer corresponding to the cubic form of SiC.

In a preferred embodiment, at least the top buffer layer is electrically conducting.

In yet another preferred embodiment, the buffer layer can be a "graded buffer layer" comprising of multiple buffer layers with varying lattice parameters to provide a good lattice match to the semiconductor layer.

In a preferred embodiment, the electronic device further comprises a semiconductor template layer between the buffer layer(s) and the semiconductor device layer to provide a good lattice match to the semiconductor device layer.

The semiconductor template layer can be a "graded semiconductor template" layer with multiple layers of varying lattice parameters so as to provide a good lattice match to the semiconductor device layer.

In a preferred embodiment, the substrate comprising the electronic device has a crystallographic texture such that the other two crystallographic axis of all the grains in-the-plane of the substrate is also characterized by a texture with a FWHM of less than 10 degrees.

In a preferred embodiment, at least one buffer layer comprising the electronic device has a crystallographic texture such that the other two crystallographic axis of all the grains in-the-plane of the substrate is also characterized by a texture with a FWHM of less than 10 degrees.

In a preferred embodiment, the said electronic device layer comprising the electronic device has a crystallographic texture such that the other two crystallographic axis of all the grains in-the-plane of the substrate is characterized by a texture with a FWHM of less than 10 degrees.

In a preferred embodiment, the substrate is selected from a group comprising Cu, Ni, Al, Mo, Nb and Fe and their alloys thereof.

In a preferred embodiment, the substrate is a Ni-based alloy with a W content in the range of 3-9 at % W.

In a preferred embodiment, the substrate is a multilayer composite substrate with only the top layer has crystallographic alignment and having the crystallographic axis of all grains in this layer aligned within 10 degrees in all directions with respect to one another.

In a preferred embodiment, the substrate is a multilayer composite substrate with only the top and bottom layers having crystallographic alignment and having the crystallographic axis of all grains in these layers aligned within 10 degrees in all directions with respect to one another.

In a preferred embodiment, the electronic device is a photovoltaic device comprising at least one pn junction parallel to the substrate surface.

In yet another preferred embodiment, the electronic device is a photovoltaic device comprising a multi-junction cell with at least two and preferably three pn junctions parallel to the substrate surface.

In a preferred embodiment, the photovoltaic conversion efficiency of said device layer is greater than 13% and preferably better than 15%.

In a preferred embodiment, the said electronic device layer consists of aligned nanodots of another crystalline composition than the device layer, with the diameter.

In yet another preferred embodiment, 80% of the nanodots are aligned within 60 degrees from the normal to the device layer.

The electronic device in accordance with this invention can be used for an application selected from a group comprising of photovoltaic devices, flat-panel displays, thermophotovoltaic devices, ferroelectric devices, light emitting diode devices, computer hard disc drive devices, magnetoresistance based devices, photoluminescence based devices, non-volatile memory devices, dielectric devices, thermoelectric devices and quantum dot laser devices.

In a preferred embodiment, the electronic device has an area larger than 50 in$^2$. In yet a further preferred embodiment, the electronic device has an area larger than 113 in$^2$.

In a preferred embodiment, the electronic device in accordance with this invention can comprise at least one device component selected from a group comprising of two terminal devices such as a diode; three terminal devices such as a transistor, thyristor or rectifier; and multi-terminal devices such as a microprocessor, random access memory, read-only-memory or a charge-coupled device.

BRIEF DESCRIPTION OF THE DRAWINGS

A fuller understanding of the present invention and the features and benefits thereof will be accomplished upon review of the following detailed description together with the accompanying drawings, in which:

FIG. 1 shows an idealized schematic representation in cross-section of various embodiments of multilayer structures in accordance with the present invention. FIG. 1 shows the most basic structure, namely a flexible metal or alloy substrate with a primary or secondary recrystallization texture of {100}<100> having a mosaic or a full-width-half-maximum (FWHM) less than 10° in all directions; single or multiple buffer layers with at least the top buffer having a {100}<100> or a 45° rotated, {100}<100> texture; an optional, epitaxial semiconductor template layer or a graded semiconductor template layer to provide improved lattice matching to device layer on top of the buffer layer(s) and finally an epitaxial semiconductor device layer—single or multiple, selected from a group comprising of but not limited to those based on indirect bandgap, direct bandgap and multi-bandgap semiconductors.

FIG. 2 shows a device comprising a flexible, crystalline, crystallographically textured, metal or alloy substrate similar to that shown in FIG. 1; crystallographically textured, single or multiple buffer layers also similar to that shown in FIG. 1; an optional epitaxial, semiconductor template layer or a graded semiconductor template layer to provide improved lattice matching to device layer on top of the buffer layer(s); textured, epitaxial p-type and n-type semiconductor layers on the top buffer layer or the optional semiconductor template layer; a transparent conductor layer and an antireflection coating with metal grid lines. One use of such a device as shown in FIG. 2 is for solar power generation.

FIG. 3A shows an idealized schematic of a simple active-matrix, organic light emitting diode (AMOLED). FIG. 3B shows an idealized schematic representation of a multijunction cell containing three cells in accordance with the present invention. In a typical multijunction cell, individual cells with different bandgaps are stacked on top of one another. The individual cells are stacked in such a way that sunlight falls first on the material having the largest bandgap. Photons not absorbed in the first cell are transmitted to the second cell, which then absorbs the higher-energy portion of the remaining solar radiation while remaining transparent to the lower-energy photons. These selective absorption processes continue through to the final cell, which has the smallest bandgap. In essence, a multijunction device is a stack of individual single-junction cells in descending order of bandgap (Eg). The top cell captures the high-energy photons and passes the rest of the photons on to be absorbed by lower-bandgap cells.

FIG. 6 shows an idealized schematic representation in cross-section of a multijunction electronic device containing three textured pn junctions in accordance with the present invention, with the pn junctions being parallel to the substrate surface. FIG. 6 shows a device comprising a flexible, crystalline, crystallographically textured, metal or alloy substrate similar to that described in FIGS. 1 and 2; crystallographically, textured, single or multiple buffer layers; an optional, epitaxial, semiconductor layer or a compositionally graded template layer; a textured, epitaxial bottom cell comprising a pn junction; a tunnel junction; a middle cell comprising a pn junction; a tunnel junction; a top cell comprising a pn junction; a transparent conductor layer; an antireflection coating and metal grid lines. One use of devices shown in FIG. 6 is for solar power generation.

FIG. 13 shows an orientation image micrograph created from acquiring and indexing electron backscatter Kikuchi diffraction patterns on a hexagonal grid at a spacing of 0.6 microns. A given grey scale shading in FIG. 13A indicates an interconnected region with misorientations less than 2 degrees. A given grey scale shading in FIG. 13B indicates an interconnected region with misorientations less than 3 degrees. Clearly, the silicon layer is representative of a large single crystal with some mosaic. The mound like particles seen in the image are there because the film was grown using the pulsed laser ablation technique in which such particulate like features are known to form. Growing a film using electron beam evaporation or chemical vapor deposition would result in nice smooth films.

FIG. 18 shows an idealized schematic representation in cross-section of various embodiments of multilayer structures in accordance with the present invention. FIG. 18A shows a flexible, crystalline, {100}<100> textured metal or alloy substrate; a crystallographically textured, epitaxial TiN buffer layer on top of the substrate, and an epitaxial Si or other semiconductor device or template layer. FIG. 18B shows a flexible, crystalline, {100}<100> textured metal or alloy substrate; a crystallographically textured, epitaxial MgO buffer layer on top of the substrate; a crystallographically textured, epitaxial TiN buffer layer on top of the MgO layer; and an epitaxial Si or other semiconductor device or template layer. FIG. 18C shows a flexible, crystalline, {100}<100> textured metal or alloy substrate; a crystallographically textured, epitaxial $Y_2O_3$ buffer layer on top of the substrate; a crystallographically textured, epitaxial YSZ buffer layer on top of the $Y_2O_3$ layer; a crystallographically textured, epitaxial TiN buffer layer on top of the YSZ layer; and an epitaxial Si or other semiconductor device or template layer. FIG. 18D shows a flexible, crystalline, {100}<100> textured metal or alloy substrate; a crystallographically textured, epitaxial $Y_2O_3$ buffer layer on top of the substrate; a crystallographically textured, epitaxial YSZ buffer layer on top of the $Y_2O_3$ layer; a crystallographically textured, epitaxial MgO buffer layer on top of the YSZ layer; a crystallographically textured, epitaxial TiN buffer layer on top of the MgO layer; and an epitaxial Si or other semiconductor device or template layer.

FIG. 19 shows an idealized schematic representation in cross-section of various embodiments of multilayer structures in accordance with the present invention. FIG. 19A shows a flexible, crystalline, {100}<100> textured metal or alloy substrate; at least one epitaxial and optionally graded, cubic nitride buffer layer on top of the substrate, and an epitaxial Si or other semiconductor device or template layer. FIG. 19B shows a flexible, crystalline, {100}<100> textured metal or alloy substrate; an epitaxial MgO buffer layer on top of the substrate; at least one epitaxial and optionally graded, cubic nitride buffer layer on top of the MgO layer; and an epitaxial Si or other semiconductor device or template layer. FIG. 19C shows a flexible, crystalline, {100}<100> textured metal or alloy substrate; an epitaxial $Y_2O_3$ buffer layer on top of the substrate; an epitaxial YSZ buffer layer on top of the $Y_2O_3$ layer; at least one epitaxial and optionally graded, cubic nitride buffer layer on top of the YSZ layer; and an epitaxial Si or other semiconductor device or template layer. FIG. 19D shows a flexible, crystalline, {100}<100> textured metal or alloy substrate; an epitaxial $Y_2O_3$ buffer layer on top of the substrate; an epitaxial YSZ buffer layer on top of the $Y_2O_3$ layer; an epitaxial MgO buffer layer on top of the YSZ layer; at least one epitaxial and optionally graded, cubic nitride buffer layer on top of the MgO layer; and an epitaxial Si or other semiconductor device or template layer.

FIG. 20 shows an idealized schematic representation in cross-section of various embodiments of multilayer structures in accordance with the present invention. FIG. 20A shows a flexible, crystalline, {100}<100> textured metal or alloy substrate; an epitaxial $γ-Al_2O_3$ buffer layer on top of the substrate, and an epitaxial Si or other semiconductor device or template layer. FIG. 20B shows a flexible, crystalline, {100}<100> textured metal or alloy substrate; an epitaxial MgO buffer layer on top of the substrate; an epitaxial $γ-Al_2O_3$ buffer layer on top of the MgO layer; and an epitaxial Si or other semiconductor device or template layer. FIG. 20C shows a flexible, crystalline, {100}<100> textured metal or alloy substrate; an epitaxial $Y_2O_3$ buffer layer on top of the substrate; an epitaxial YSZ buffer layer on top of the $Y_2O_3$ layer; an epitaxial $γ-Al_2O_3$ buffer layer on top of the YSZ layer; and an epitaxial Si or other semiconductor device or template layer. FIG. 20D shows a flexible, crystalline, {100}<100> metal or alloy substrate; an epitaxial $Y_2O_3$ buffer layer on top of the substrate; an epitaxial YSZ buffer layer on top of the $Y_2O_3$ layer; an epitaxial MgO buffer layer on top of the YSZ layer; an epitaxial $γ-Al_2O_3$ buffer layer on top of the MgO layer; and an epitaxial Si or other semiconductor device or template layer.

FIG. 21 shows an idealized schematic representation in cross-section of various embodiments of multilayer structures in accordance with the present invention. FIG. 21A shows a flexible, crystalline, {100}<100> textured metal or alloy substrate; at least one epitaxial and optionally graded, cubic oxide buffer layer on top of the substrate, and an epitaxial Si or other semiconductor device or template layer. FIG. 21B shows a flexible, crystalline, {100}<100> textured metal or alloy substrate; an epitaxial MgO buffer layer on top of the substrate; at least one epitaxial and optionally graded, cubic oxide buffer layer on top of the MgO layer; and an epitaxial Si or other semiconductor device or template layer. FIG. 21C shows a flexible, crystalline, [100]<100> textured metal or alloy substrate; an epitaxial $Y_2O_3$ buffer layer on top of the substrate; an epitaxial YSZ buffer layer on top of the $Y_2O_3$ layer; at least one epitaxial and optionally graded, cubic oxide buffer layer on top of the YSZ layer; and an epitaxial Si or other semiconductor device or template layer. FIG. 21D shows a flexible, crystalline, {100}<100> textured metal or alloy substrate; an epitaxial $Y_2O_3$ buffer layer on top of the substrate; an epitaxial YSZ buffer layer on top of the $Y_2O_3$ layer; an epitaxial MgO buffer layer on top of the YSZ layer; at least one epitaxial and optionally graded, cubic oxide buffer layer on top of the MgO layer; and an epitaxial Si or other semiconductor device or template layer.

FIG. 23A shows an idealized schematic representation in cross-section of a composite substrate which contains a crystallographically untextured or unaligned bottom with a top surface which is {100}<100> textured or aligned such that the all the grains in this layer are aligned in all directions within 10 degrees. FIG. 23B shows an idealized schematic representation in cross-section of a composite substrate which contains a crystallographically untextured or unaligned center with a top and bottom surface which is {100}<100> textured or aligned such that all the grains in this layer are aligned in all directions within 10 degrees.

DETAILED DESCRIPTION OF THE PREFERRED EMBODIMENTS

Figure 2:
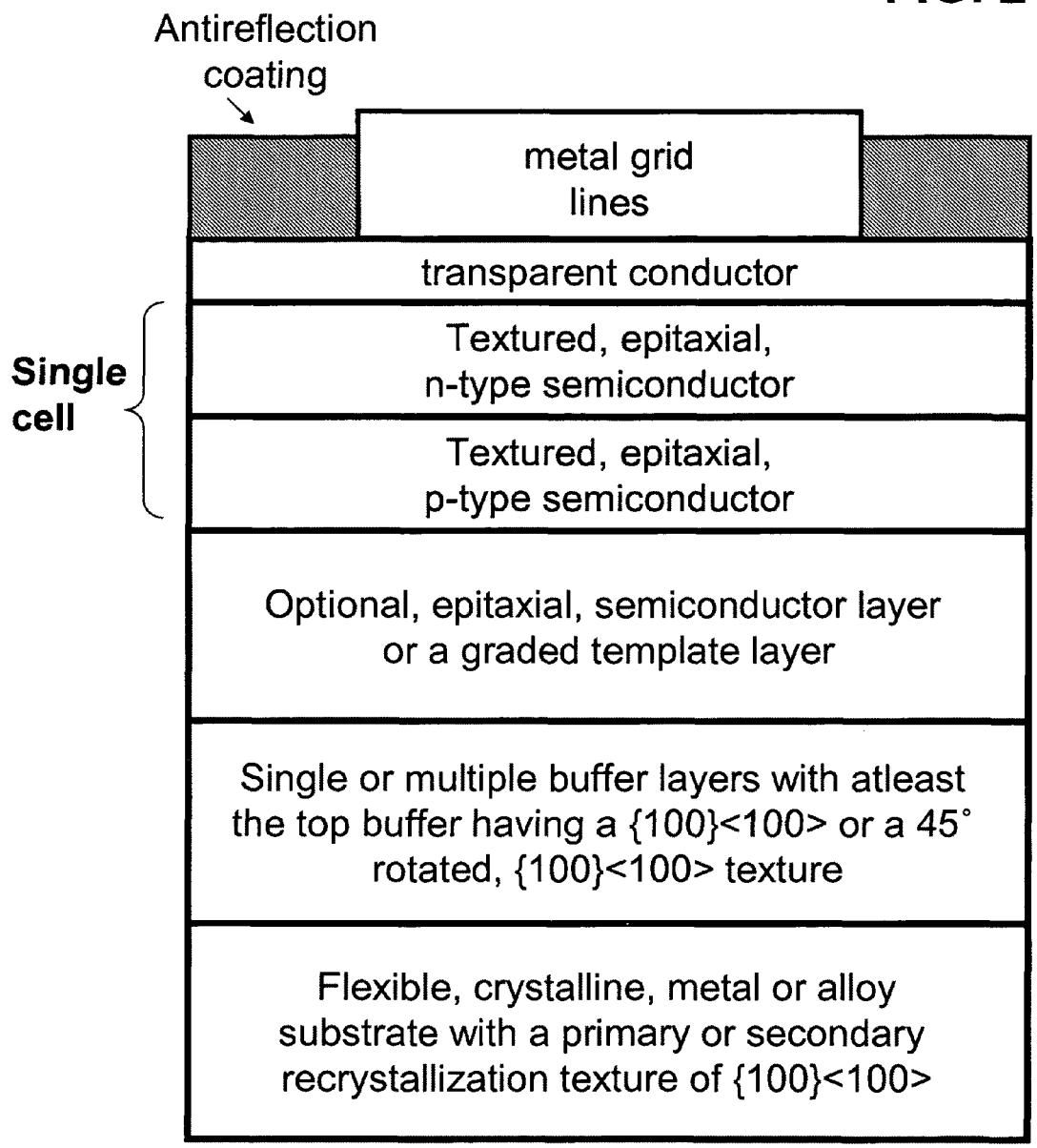
FIG. 2 shows an idealized schematic representation in cross-section of an electronic device containing an epitaxial, textured pn junction in accordance with the present invention, with the pn junction being parallel to the substrate surface.

The invention relates to fabrication of large-area, flexible, crystallographically textured, semiconductor based electronic devices which have high performance. The invention also enables continuous fabrication of such devices using reel-to-reel deposition.

FIG. 1 shows an idealized schematic representation in cross-section of various embodiments of multilayer structures in accordance with the present invention. FIG. 1A shows the most basic structure, namely a flexible metal or alloy substrate with macroscopic, out-of-plane texture of [100] or [110] having a full-width-half-maximum (FWHM) less than 10°; single or multiple buffer layers with a out-of-plane texture of [100] or [110] with a FWHM less than 10° on top of this metal or alloy substrate; an optional, epitaxial semiconductor template layer or a graded semiconductor template layer to provide improved lattice matching to device layer on top of the buffer layer(s) and finally an epitaxial semiconductor device layer—single or multiple, selected from a group comprising of but not limited to those based on indirect bandgap, direct bandgap and multibandgap semiconductors. FIG. 1B comprises a device structure including a flexible, crystalline, metal or alloy substrate with a out-of-plane texture of [100] or [110] with a FWHM less than 10°, and also having the other two perpendicular crystallographic axis of all grains aligned with a FWHM of 10°; single or multiple buffer layers on top of the substrate with an out-of-plane texture of [100] or [110] with a FWHM less than 10°, and also having the other two perpendicular crystallographic axis of all grains aligned within 10°; an optional, epitaxial semiconductor template layer or a graded semiconductor template layer on top of the buffer layer to provide improved lattice matching with the device layer; and an epitaxial semiconductor device layer—single or multiple, selected from a group comprising of but not limited to those based on indirect bandgap, direct bandgap and multibandgap semiconductors.

A [100] or [110] textured semiconductor is useful for achieving high device performance. Uniaxially textured metal or alloy templates can be fabricated by thermomechanical processing techniques such as rolling and annealing, pressing or stamping and annealing, forging and annealing, drawing and annealing and swaging and annealing. A combination of these deformation and annealing steps can also be used to fabricate a metal or alloy substrate using routine experimentation which has a sharp and well-defined out-of-plane uniaxial texture and a large average grain size. For all thermomechanical processing routes, the crystallographic texture we are referring to in this invention or patent application is the annealing or recrystallization texture and not the deformation texture. "Deformation texture" is the crystallographic texture which develops in metals and alloys upon mechanical deformation and the process of deformation results in plastically deformed grains. Deformation texture can also be quite sharp and biaxial and has certain specific orientations in cubic materials. Details about typical deformation textures in metals and alloys that can be produced by mechanical deformation can be found in the text books—"Structure of Metals" by Charles Barrett and T. B. Massalski, $3^{rd}$ edition, Pergamon Press, 1980, pages 541-566; "Recrystallisation and related annealing phenomena" by F J Humphreys, M Hatherly, published by Elsevier in 2004, pages 43-54. Recrystallization is a process by which deformed grains are replaced by a new set of undeformed grains that nucleate and grow until the original grains have been entirely consumed. A detailed definition of recrystallization can be obtained from literature in the field or from the online free encyclopedia, Wikipedia's website—http://en.wikipedia.org/wiki/Recrystallization (metallurgy). The crystallographic texture upon the process of recrystallization is referred to as recrystallization texture. Details about how annealing or recrystallization texture can be produced by thermomechanical processing can be found in book titled "Recrystallisation and related annealing phenomena" by F J Humphreys, M Hatherly, published by Elsevier in 2004, pages 327-415; "Structure of Metals" by Charles Barrett and T. B. Massalski, $3^{rd}$ edition, Pergamon Press, 1980, pages 568-582; All references indicated in the book are also included as relevant references. Details of how to develop uniaxial texture, biaxial texture and triaxial recrystallization texture can be found in the book. In particular, details of how to develop a [100] or [110] recrystallization textures in cubic, face-centered and body-centered metals and alloys is discussed in detail in the book. In this invention, crystallographically textured, and fully recrystallized metals and alloys are of specific interest. This is because the surface of as-rolled and textured metals and alloys is not readily amenable for epitaxial growth of other materials. Moreover, deformation textures in general, do not have the desired crystallographic orientations for integration with semiconductors via suitable buffer layers. Buffer layer(s) are used to provide a chemical barrier and a structural template on which to grow the semiconductor layer(s). A chemical barrier is needed to prevent diffusion of elements from the metal/alloy or ceramic substrate to the semiconductor layer(s). Buffer layers can be selected from a group comprising a metal, an alloy, a nitride, boride, oxide, fluoride, carbide, silicide or combinations thereof. The buffer layer can be a nitride buffer layer corresponding to a composition of MN, wherein N is Nitrogen and M is selected from a group comprising Ti, Ce, Y, Zr, Hf, V, Nb, Nd, La, and Al and their combinations thereof. The buffer layer can be an oxide buffer layer selected from a group comprising gamma $Al_2O_3$ (cubic form of $Al_2O_3$); perovskites such as but not limited to $SrTiO_3$, $(Sr,Nb)TiO_3$, $BaTiO_3$, $(Ba,Ca)TiO_3$, $LaMnO_3$, $LaAlO_3$, doped perovskites such as $(La,Sr)MnO_3$, $(La,Ca)MnO_3$; layered perovskites such as $Bi_4Ti_3O_{12}$; pyrochlores such as but not limited to $La_2Zr_2O_7$, $Ca_2Zr_2O_7$, $Gd_2Zr_2O_7$; flourites such as $Y_2O_3$, YSZ; rock-salt oxides such as but not limited to MgO; spinets such as but not limited to $MgAl_2O_4$, The buffer layer can also comprise a mixture of a nitride and an oxide with a chemical formula $MN_xO_y$ (1<x, y>0), wherein N is Nitrogen and O is Oxygen, and M is selected from a group comprising Ti, Ce, Y, Zr, Hf, V, Nb, Nd, La, and Al and their combinations thereof. A structural template comprised of buffer layers is needed to obtain a good lattice match to the semiconductor layer being grown so as to minimize the defect density in the semiconductor layer.

In some cases, an additional semiconductor template layer is used before the semiconductor device layer(s). This semiconductor template layer again is used to provide for a better lattice match to semiconductor device layer. Another function of the top buffer layer is to provide a stable, smooth and dense surface to grow the semiconductor layer on. Buffer layer surfaces can be conditioned chemically or thermally. In chemical conditioning, one or more chemical species in gaseous or solution form is used modify the surface of the buffer layer. In thermal conditioning, the buffer layer is heated to an elevated temperature wherein surface reconstruction takes place. Surface conditioning can also be done using standard and well developed techniques of plasma etching and reactive ion etching (see for example, Silicon processing for the VSLI Era, Vol. 1, eds. S. Wolf and R. N. Tanber, pages 539-574, Lattice Press, Sunset Park, Calif., 1986).

The said [100] or [110] textured semiconductor device layer in FIG. 1 can be selected from a group comprising of but not limited to those based on indirect bandgap semiconductors such as Si, Ge, GaP; direct bandgap semiconductors such as CdTe, $CuInGaSe_2$ (CIGS), GaAs, AlGaAs, GaInP and AlInP; multiband semiconductors such as II-O-VI materials like $Zn_{1-y}Mn_yO_xTe_{1-x}$ and III-N-V multiband semiconductors such as $GaN_xAs_{1-x-y}P_y$, and combinations thereof. This includes minor dopants of other materials in the semiconductor layers for obtaining the required n-type or p-type semiconducting properties. Definitions of a "direct", "indirect" and "multiband" semiconductor can be obtained from literature in the field or from the online free encyclopedia, Wikipedia (http://en.wikipedia.org/wiki/Main Page). For example, as stated in Wikipedia, the definition of direct and indirect bandgap semiconductor is—"In semiconductor physics, a direct bandgap means that the minimum of the conduction band lies directly above the maximum of the valence band in momentum space. In a direct bandgap semiconductor, electrons at the conduction-band minimum can combine directly with holes at the valence band maximum, while conserving momentum. The energy of the recombination across the bandgap will be emitted in the form of a photon of light. This is radiative recombination, also called spontaneous emission. In indirect bandgap semiconductors such as crystalline silicon, the momentum of the conduction band minimum and valence band maximum are not the same, so a direct transition across the bandgap does not conserve momentum and is forbidden. Recombination occurs with the mediation of a third body, such as a phonon or a crystallographic defect, which allows for conservation of momentum. These recombinations will often release the bandgap energy as phonons, instead of photons, and thus do not emit light. As such, light emission from indirect semiconductors is very inefficient and weak. There are new techniques to improve the light emission by indirect semiconductors. See indirect bandgap for an explanation. The prime example of a direct bandgap semiconductor is gallium arsenide—a material commonly used in laser diodes."

In a preferred embodiment of the present invention, the said semiconductor layer in the article is a compound semiconductor composed of elements from two or more different groups of the Periodic Table, including compounds of Group III (B, Al, Ga, In) and Group V (N, P, As, Sb, Bi) for the compounds AlN, AlP, AlAs, GaN, GaP, GaAs, InP, InAs, InSb, AlInGaP, AlGaAs, InGaN etc, and the compounds of Group II (Zn, Cd, Hg) and Group VI (O, S, Se, Te) such as ZnS, ZnSe, ZnTe, CdTe, HgTe, CdHgTe etc. In addition to binary compounds of the above, ternary (three elements, e.g. InGaAs) and quaternary (four elements, e.g. InGaAsP) compounds are also are included.

The semiconductor layer in the article can also comprise an elemental semiconductor or alloys of elements within the same group such as SiC and SiGe or a compound semiconductor comprising elements of group IB, IIIA and VIA of the periodic table such as alloys of copper, indium, gallium, aluminum, selenium and sulfur.

FIG. 2 shows an idealized schematic representation in cross-section of an electronic device containing an epitaxial, textured pn junction in accordance with the present invention, with the pn junction being parallel to the substrate surface. FIG. 2 shows a device comprising a flexible, crystalline, crystallographically textured, metal or alloy substrate similar to that shown in FIG. 1; crystallographically textured, single or multiple buffer layers also similar to that shown in FIG. 1; an optional epitaxial, semiconductor template layer or a graded semiconductor template layer to provide improved lattice matching to device layer on top of the buffer layer(s); textured, epitaxial p-type and n-type semiconductor layers on the top buffer layer or the optional semiconductor template layer; a transparent conductor layer and an antireflection coating with metal grid lines. A p-type semiconductor is obtained by carrying out a process of doping in which certain types of atoms are incorporated into the semiconductor in order to increase the number of free (in this case positive) charge carriers. When the doping material is added, it takes away (accepts) weakly-bound outer electrons from the semiconductor atoms. This type of doping agent is also known as acceptor material and the semiconductor atoms that have lost an electron are known as holes. The purpose of p-type doping is to create an abundance of holes. In the case of silicon, a trivalent atom (typically from group IIIA of the periodic table, such as boron or aluminum) is substituted into the crystal lattice. The result is that one electron is missing from one of the four covalent bonds normal for the silicon lattice. Thus the dopant atom can accept an electron from a neighboring atoms' covalent bond to complete the fourth bond. Such dopants are called acceptors. The dopant atom accepts an electron, causing the loss of half of one bond from the neighboring atom and resulting in the formation of a "hole". Each hole is associated with a nearby negative-charged dopant ion, and the semiconductor remains electrically neutral as a whole. However, once each hole has wandered away into the lattice, one proton in the atom at the hole's location will be "exposed" and no longer cancelled by an electron. For this reason a hole behaves as a quantity of positive charge. When a sufficiently large number of acceptor atoms are added, the holes greatly outnumber the thermally-excited electrons. Thus, the holes are the majority carriers, while electrons are the minority carriers in p-type materials. An n-type semiconductor is obtained by carrying out a process of doping, that is, by adding an impurity of valence-five elements to a valence-four semiconductor in order to increase the number of free (in this case negative) charge carriers. When the doping material is added, it gives away (donates) weakly-bound outer electrons to the semiconductor atoms. This type of doping agent is also known as donor material since it gives away some of its electrons. The purpose of n-type doping is to produce an abundance of mobile or "carrier" electrons in the material. To help understand how n-type doping is accomplished, consider the case of silicon (Si). Si atoms have four valence electrons, each of which is covalently bonded with one of four adjacent Si atoms. If an atom with five valence electrons, such as phosphorus (P), arsenic (As), or antimony (Sb), is incorporated into the crystal lattice in place of a Si atom, then that atom will have four covalent bonds and one unbonded electron. This extra electron is only weakly bound to the atom and can easily be excited into the conduction band. At normal temperatures, virtually all such electrons are excited into the conduction band. Since excitation of these electrons does not result in the formation of a hole, the number of electrons in such a material far exceeds the number of holes. In this case the electrons are the majority carriers and the holes are the minority carriers. Because the five-electron atoms have an extra electron to "donate", they are called donor atoms. Hence, p and n-type semiconductors can be fabricated by appropriate doping of elements. The device in FIG. 2 is referred to a p-n junction, with the junction being parallel to the substrate surface. The p-type and n-type layer combination is referred to as a single cell. This device shown in FIG. 2 is only a simple example of a possible device structure that can be fabricated based on this invention. A possible use of such a device is as a solar cell or a photovoltaic cell to convert sunlight into electrical energy. The order of which layer, namely the p-type or n-type can be changed. Also, in some cases it may be desirable to include layers of p+ in which the excess mobile hole concentration is very large. Similarly an n+ layer can be deposited. Such layers can also be used for making electrical contacts in devices.

The basic structures shown in FIG. 1 and FIG. 2 can be used to fabricate a whole range of electronic devices such as photovoltaic devices, flat-panel displays, thermophotovoltaic devices, ferroelectric devices, light emitting diode devices, computer hard disc drive devices, magnetoresistance based devices, photoluminescence based devices, non-volatile memory devices, dielectric devices, thermoelectric devices and quantum dot laser devices. Electronic devices that can readily be envisioned are two terminal devices such as a diode; three terminal devices such as a transistor, thyristor or rectifier; and multi-terminal devices such as a microprocessor, random access memory, read-only-memory or a charge-coupled device.

Some of most exciting applications are in photovoltaics or solar cells and for displays such as thin-film transistors. In both of these areas, there is has been a drive to use thin films on metal substrates. However, in these cases, the semiconductor is either amorphous or polycrystalline and hence with lower performance than obtained from a single crystal device of the same semiconductor. Mechanically flexible electronics have the potential to realize novel applications in which in which physical and mechanical restrictions do not permit the use of rigid substrates. Furthermore, with flexible substrates, roll-to-roll manufacturing can be envisioned similar to a printing press with a throughput significantly higher than normal discrete semiconductor device manufacturing. In some of the applications alluded to above, relatively relaxed device requirements exist compared to other semiconductor devices. The integration of triaxially textured, single-crystal-like semiconductor layers and devices on large-area, flexible, metal, alloy and ceramic substrates, can revolutionize these applications in these areas. Single-crystal devices on flexible substrates will result in photovoltaic cells with high efficiencies and thin-film transistors (TFT) with higher electron mobilities.

There is significant interest in the fabrication of TFT circuits on flexible metal or alloy foils. See for example—Thesis S.D. and Wagner S., "Amorphous silicon thin-film transistors on steel foil substrates," IEEE Electron Device Lett., vol. 17, no. 12, pp. 578-580, December 1996; Serikawa T. and Omata F., "High-mobility poly-Si TFT's fabricated on flexible stainless steel substrates," IEEE Electron Device Lett., vol. 20, no. 11, pp. 574-576, November 1999; Afentakis T. and Hatalis M., "High performance polysilicon circuits on thin metal foils," Proc. SPIE, vol. 5004, pp. 122-126, 2003; Howell R. S., Stewart M., Karnik S. V., Saha S. K. and Hatalis M. K., IEEE Electron Device Lett., vol. 21, no. 2, pp. 70-72, February 2000. In all four of these papers, the result is an oriented, polycrystalline or amorphous Si layer. In most cases wherein polycrystalline Si is used, it is a laser crystallized layer of Si. An amorphous layer of Si is first deposited on to the substrate followed by a crystallization step. This crystallization can also be done using infrared lamps which provide for a high heating rate. A similar process can be used to fabricate epitaxial silicon on the substrates disclosed in this invention. This process of first depositing a precursor film of amorphous Si followed by a subsequent crystallization step is referred to as an "ex-situ" process. Crystalline Si can also be directly deposited epitaxially on single crystal-like substrate at elevated temperatures. Triaxially textured, single-crystal devices on flexible metal, alloy and ceramic substrates will result in thin-film transistors (TFT) with higher electron mobilities than can be fabricated using unoriented silicon and hence truly have the potential for revolutionizing this application. Advanced flat panel displays including active matrix liquid crystal displays (LCD) have mainly used thick glass as the substrate which offers advantages of transparency and stability but is very fragile and heavy. The substrates suggested here will be rugged and light weight and because of the device layer being triaxially textured or single-crystal-like, will have a performance far superior to those possible on rigid glass substrates. Flat panel display applications are enormous and include computer monitors, televisions, large electronic billboards, cell phones, calculators and display screens on a whole set of consumer electronics. For portable displays active-matrix liquid crystal displays (AMLCDs) and active-matrix organic light emitting diode (AMOLED), using a low temperature processed polycrystalline Si on glass is being widely considered for large-scale applications. An active-matrix OLED (AMOLED) display consists of organic light emitting diode (OLED) pixels that have been deposited or integrated onto a thin film transistor (TFT) array to form a matrix of pixels that illuminate light upon electrical activation. In contrast to a passive-matrix OLED display, where electricity is distributed row by row, the active-matrix TFT backplane acts as an array of switches that control the amount of current flowing through each OLED pixel. The TFT array continuously controls the current that flows to the pixels, signaling to each pixel how brightly to shine. Typically, this continuous current flow is controlled by at least two TFTs at each pixel, one to start and stop the charging of a storage capacitor and the second to provide a voltage source at the level needed to create a constant current to the pixel. As a result, the AMOLED operates at all times (i.e., for the entire frame scan), avoiding the need for the very high currents required for passive matrix operation. Poly-Silicon backplane technology for fabricating the TFT array is the technology-of-choice for OLEDs today because it provides reasonable mobilities that meet OLED current drive requirements (see for example, Afentakis T., Hatalis M., Voutsas T. and Hartzell J., "Poly-silicon TFT AM-OLED on thin flexible metal substrates," Proc. SPIE, vol. 5004, pp. 187-191, 2003). Poly-Si technology also allows for the integration of the drive circuitry directly onto the substrate. There are many key challenges, however, to address: reducing threshold voltage non-uniformities of poly-Si, and demonstrating commercially-viable manufacturing yields. These issues can potentially be addressed using the devices of this invention wherein triaxially textured or single-crystal-like nature of the semiconductor device layer will reduce non-uniformities and increase yields, significantly increase mobilities and still be light weight because no glass is used. FIG. 3A shows a schematic of a simple AMOLED device. FIG. 3A when coupled with FIGS. 1 and 2, shows how an AMOLED based on this invention can be fabricated, wherein the TFT/Substrate array is fabricated using this invention.

An important application of the devices disclosed in this invention is in the area of photovoltaics. The devices shown schematically in FIG. 2 can be used as a photovoltaic or solar cell. These devices will be large-area and flexible and can be put on roofs. Flexible solar cells are also useful for space applications since large arrays or spools of photovoltaic modules can be wrapped up and then unspooled in space.

One way to make solar cells more efficient is to find a material that will capture energy from a larger portion of the spectrum of sunlight—from infrared to visible light to ultraviolet. Energy transfers from photons to a photovoltaic material when the material absorbs lightwaves that contain the same amount of energy as its bandgap. A bandgap is the energy ($E_g$) required to push an electron from a material's valence band to the conduction band where electrons are free to flow. FIG. 3B shows a schematic of a device containing three photovoltaic cells of different bandgaps. This structure, also called a cascade or tandem cell, can achieve higher total conversion efficiency by capturing a larger portion of the solar spectrum. In the typical multijunction cell, individual cells with different bandgaps are stacked on top of one another. The individual cells are stacked in such a way that sunlight falls first on the material having the largest bandgap. Photons not absorbed in the first cell are transmitted to the second cell, which then absorbs the higher-energy portion of the remaining solar radiation while remaining transparent to the lower-energy photons. These selective absorption processes continue through to the final cell, which has the smallest bandgap. Such multijunction cells can result in very high efficiencies. Principals of multijunction cells can be obtained from prior art (Martin A. Green, Keith Emery, Klaus Bücher, David L. King, Sanekazu Igari, "Solar cell efficiency tables (version 11)," Progress in Photovoltaics: Research and Applications, Volume 6, Issue 1, Pages 35-42, 4 May 1999; Karam, N. H.; King, R. R.; Cavicchi, B. T.; Krut, D. D.; Ermer, J. H.; Haddad, M.; Li Cai; Joslin, D. E.; Takahashi, M.; Eldredge, J. W.; Nishikawa, W. T.; Lillington, D. R.; Keyes, B. M.; Ahrenkiel, R. K., "Development and characterization of high-efficiency Ga0.5In0.5P/GaAs/Ge dual- and triple-junction solar cells," Electron Devices, IEEE Transactions on, Vol. 46, No. 10, pp. 2116-2125, October 1999; H. Hou, K. Reinhardt, S. Kurtz, J. Gee, A. Allerman, B. Hammons, P. Chang, E. Jones, Novel InGaAsN pn junction for high-efficiency multiple-junction solar cells, The Second World Conference on PV Energy Conversion, 1998, pp. 3600-3603; D. Friedman, J. Geisz, S. Kurtz, J. Olson, 1-eV GaInNAs solar cells for ultra high efficiency multijunction devices, The Second World Conference on PV Energy Conversion, 1998, pp. 3-7; T. V. Torchynska and G. Polupan, "High efficiency solar cells for space applications," Superficies y Vacío 17(3), 21-25, septiembre de 2004; R. McConnell and M. Symko-Davies, "DOE High Performance Concentrator PV Project," International Conference on Solar Concentrators for the Generation of Electricity or Hydrogen, 1-5 May 2005, Scottsdale, Ariz., NREL/CD-520-38172).

Figures 4, 4A, 4B, 4C:
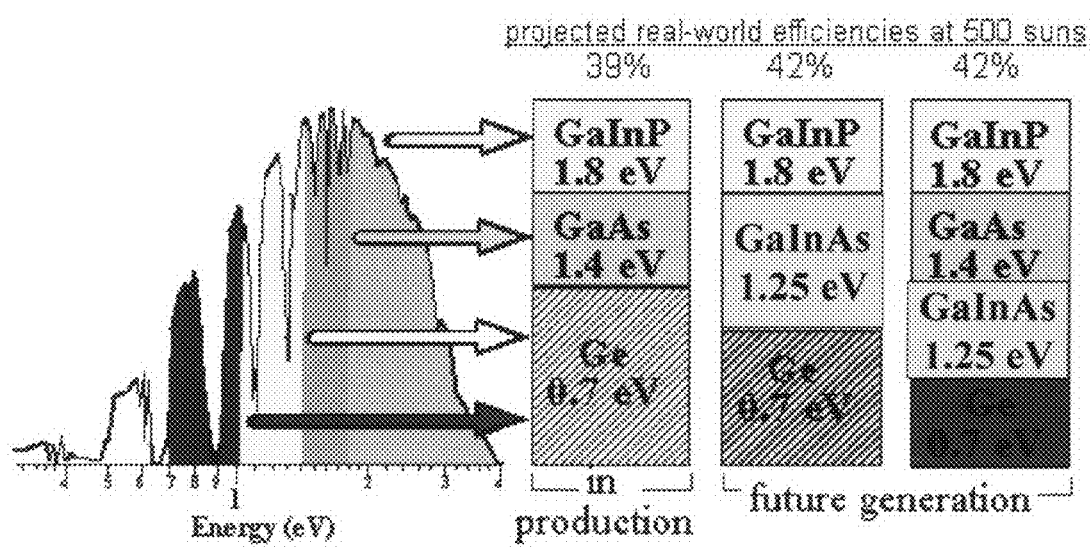
FIG. 4 shows the cross-section of some multijunction cells that have been reported in the literature. The schematic shows the portion of the sun's spectrum that they capture and the projected conversion efficiencies of these cells which are all close to 40%.
FIG. 4A shows a tri-junction cell of GaInP (Eg=eV)/GaAs (1.4 eV)/Ge (0.7 eV)
FIG. 4B shows a tri-junction cell of GaInP (Eg=eV)/GaInAs (1.25 eV)/Ge (0.7 eV)
FIG. 4C shows a four-junction cell of GaInP (Eg=eV)/GaAs (1.4 eV)/GaInAs (1.25 eV)/Ge (0.7 eV).
Figure 5:
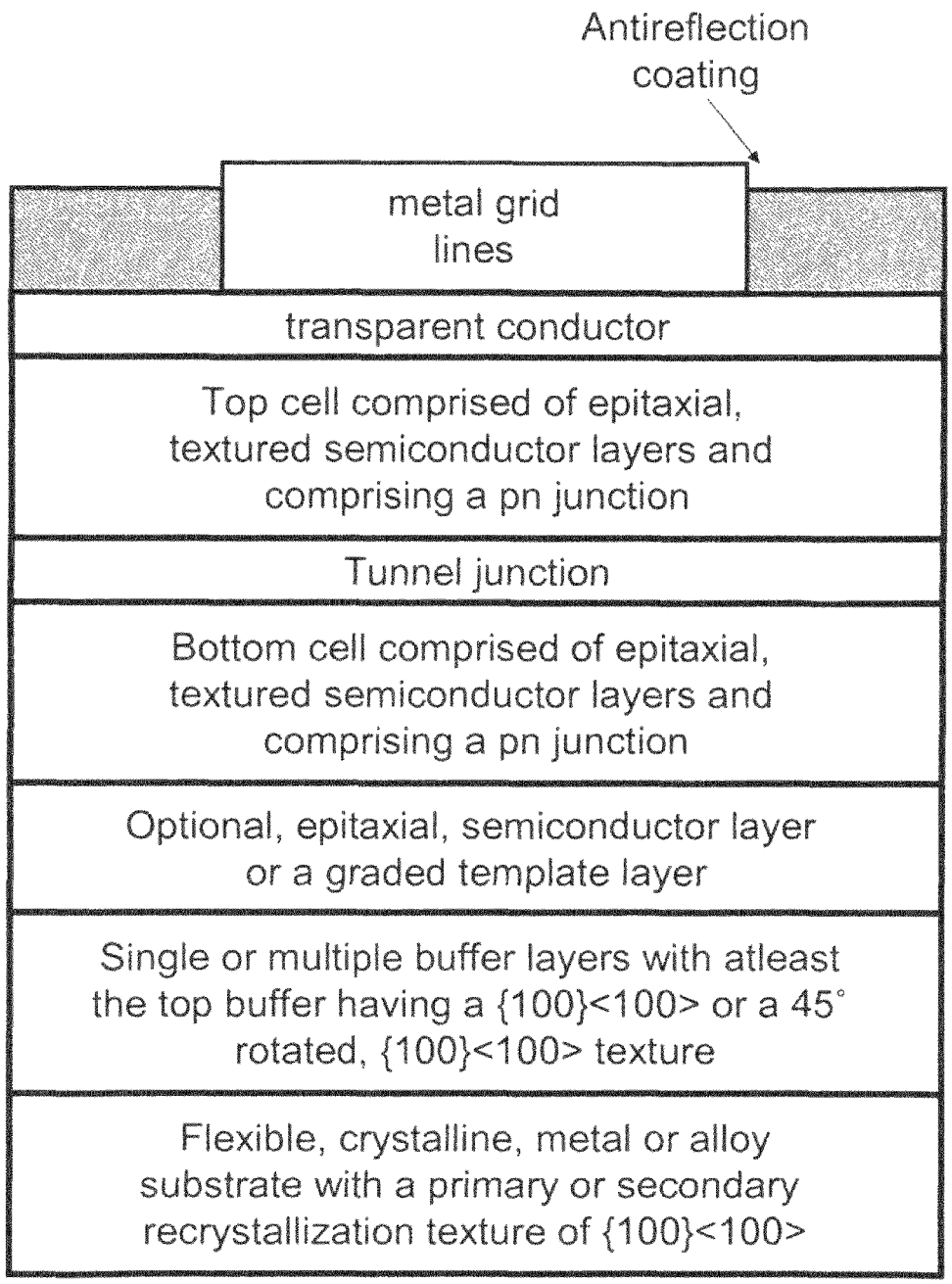
FIG. 5 shows an idealized schematic representation in cross-section of a multijunction electronic device containing two textured, epitaxial pn junctions in accordance with the present invention, with the pn junctions being parallel to the substrate surface.
Figure 6:
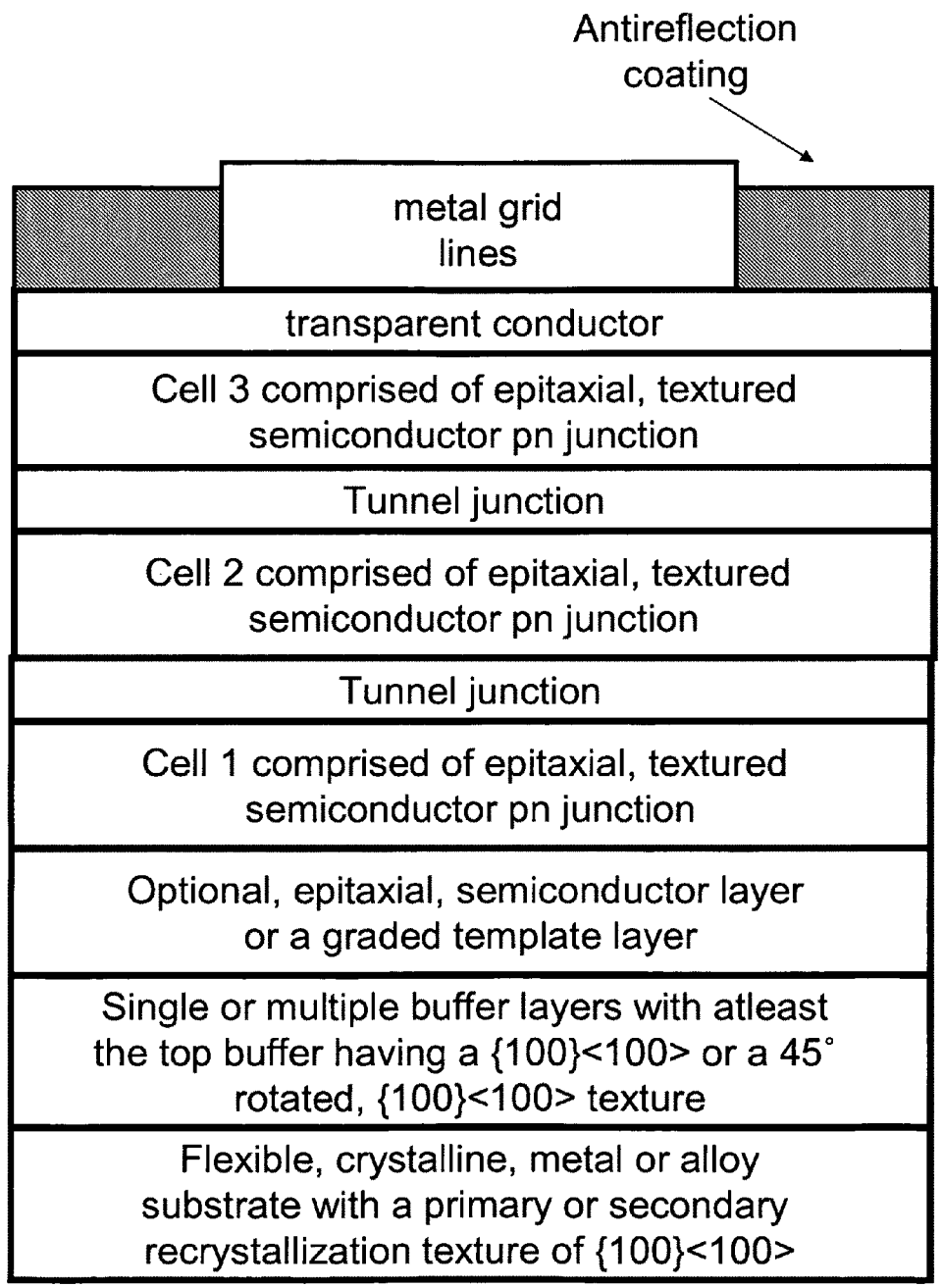
FIG. 6 shows a device comprising a flexible, crystalline, crystallographically textured, metal or alloy substrate similar to that described in FIGS. 1 and 2; crystallographically, textured, single or multiple buffer layers; an optional, epitaxial, semiconductor layer or a compositionally graded template layer; a textured, epitaxial bottom cell comprising a pn junction; a tunnel junction; a top cell comprising a pn junction; a transparent conductor layer; an antireflection coating and metal grid lines. One use of devices shown in FIG. 5 is for solar power generation.
Figure 7:
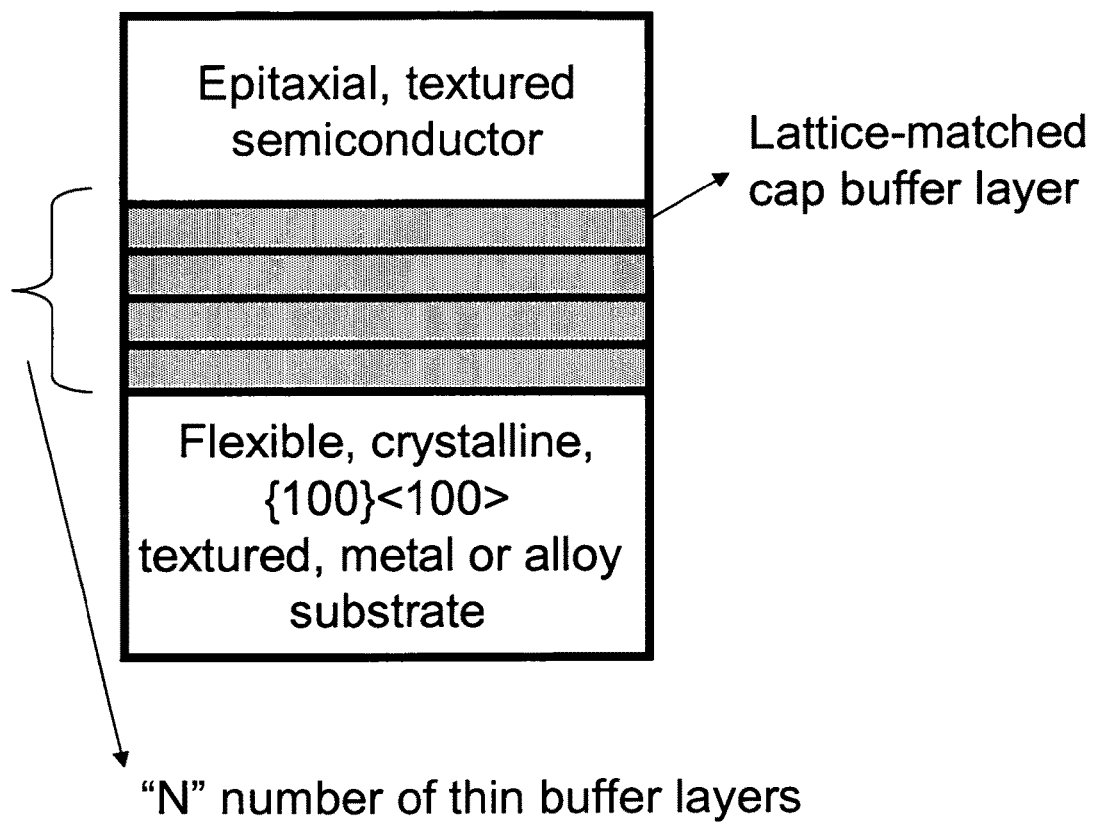
FIG. 7 shows an idealized schematic representation in cross-section of an electronic device as depicted in FIG. 1-6, with the buffer layer stack comprised of a number of thin buffer layers so as to provide a good lattice match to the semiconductor layer grown on the top buffer template. This referred to as a "compositionally graded buffer approach" for providing a good lattice match to the semiconductor to minimize defect density in the semiconductor layer.

Shown in FIG. 4 is the cross-section of some multijunction cells that have been reported in the literature. The schematic shows the portion of the sun's spectrum that they capture and the projected conversion efficiencies of these cells which are all close to 40%. FIG. 4A shows a tri-junction cell of GaInP (Eg=eV)/GaAs (1.4 eV)/Ge (0.7 eV); FIG. 4B shows a tri-junction cell of GaInP (Eg=eV)/GaInAs (1.25 eV)/Ge (0.7 eV); and FIG. 4C shows a four-junction cell of GaInP (Eg=eV)/GaAs (1.4 eV)/GaInAs (1.25 eV)/Ge (0.7 eV). Clearly the advantage of capturing a higher portion of sun's spectrum is higher conversion efficiency. FIG. 5 shows an idealized schematic representation in cross-section of a multijunction electronic device containing two textured, epitaxial pn junctions in accordance with the present invention, with the pn junctions being parallel to the substrate surface. FIG. 5 shows a device comprising a flexible, crystalline, crystallographically textured, metal or alloy substrate similar to that described in FIGS. 1 and 2; crystallographically, textured, single or multiple buffer layers; an optional, epitaxial, semiconductor layer or a compositionally graded template layer; a textured, epitaxial bottom cell comprising a pn junction; a tunnel junction; a top cell comprising a pn junction; a transparent conductor layer; an antireflection coating and metal grid lines. One use of devices shown in FIG. 5 is for solar power generation. FIG. 7 shows an idealized schematic representation in cross-section of a multijunction electronic device containing three textured pn junctions in accordance with the present invention, with the pn junctions being parallel to the substrate surface. FIG. 6 shows a device comprising a flexible, crystalline, crystallographically textured, metal or alloy substrate similar to that described in FIGS. 1 and 2; crystallographically, textured, single or multiple buffer layers; an optional, epitaxial, semiconductor layer or a compositionally graded template layer; a textured, epitaxial bottom cell comprising a pn junction; a tunnel junction; a middle cell comprising a pn junction; a tunnel junction; a top cell comprising a pn junction; a transparent conductor layer; an antireflection coating and metal grid lines. Again, one use of devices shown in FIG. 6 is for solar power generation.

Performance of electronic device is dependent on defect density. One way to reduce defect density in the active semiconductor layer is to reduce its lattice mismatch to the top buffer layer. This can be done using a "graded buffer layer" approach. FIG. 7 shows an idealized schematic representation in cross-section of an electronic device as depicted in FIG. 1-6, with the buffer layer stack comprised of a number of thin buffer layers with gradually differing lattice parameters so as to provide a good lattice match to the semiconductor layer grown on the top buffer template. This is referred to as a "graded buffer approach" for providing a good lattice match to the semiconductor to minimize defect density in the semiconductor layer. The number of layers of graded lattice parameter buffers that need to be deposited depends on lattice mismatch between the semiconductor and the substrate.

A better lattice match to the semiconductor layer to enable higher quality epitaxy and reduce the defect density in the semiconductor layer can also be obtained by using mixed or doped rock salt structure buffer layers, mixed or doped perovskite buffer layers, mixed of doped pyrochlore buffer layers, For example mixed rock-salt structure oxides (AO, where A is a metal), nitrides (AN, where A is a metal) and oxynitrides ($AN_xO_{1-x}$, where A is a metal), mixed perovskites ($ABO_3$, where A and B are metals), mixed pyrochlores ($A_2B_2O_7$, where A and B are metals) or mixed bixbyite ($A_2O_3$, where A is a metal) structure oxide buffer layers can be used to tailor the lattice constant in order to obtain a better lattice match to the semiconductor layer. The following mixed oxide and nitride buffer layers are of interest in particular:

1) Mixed rock-salt structure oxides and nitrides such as $A_xB_{1-x}O$ and $A_xB_{1-x}N$, where A and B are different metals. For example, $Ba_{0.64}Sr_{0.36}O$, a solid solution of BaO and SrO, provides an excellent lattice match to Si.
2) Mixed oxynitrides such as $A_xB_{1-x}N_yO_{1-y}$, where A and B are different metals.
3) Mixed bixbyite structures such as $(A_xB_{1-x})_2O_3$, where A and B are different metals.
4) Mixed perovskites $(A_xA'_{1-x})BO_3$, $(A_xA'_{1-x})(B_yB'_{1-y})O_3$, where A, A', B and B' are different metals. For example, $Ca_{0.95}Sr_{0.05}TiO_3$, a solid solution of $CaTiO_3$ and $SrTiO_3$, provides an excellent lattice match to Si.
5) Mixed pyrochlores—$(A_xA'_{1-x})_2B_2O_7$, $(A_xA'_{1-x})_2(B_yB'_{1-y})_2O_7$, where A, A', B and B' are different metals.

Figure 8:
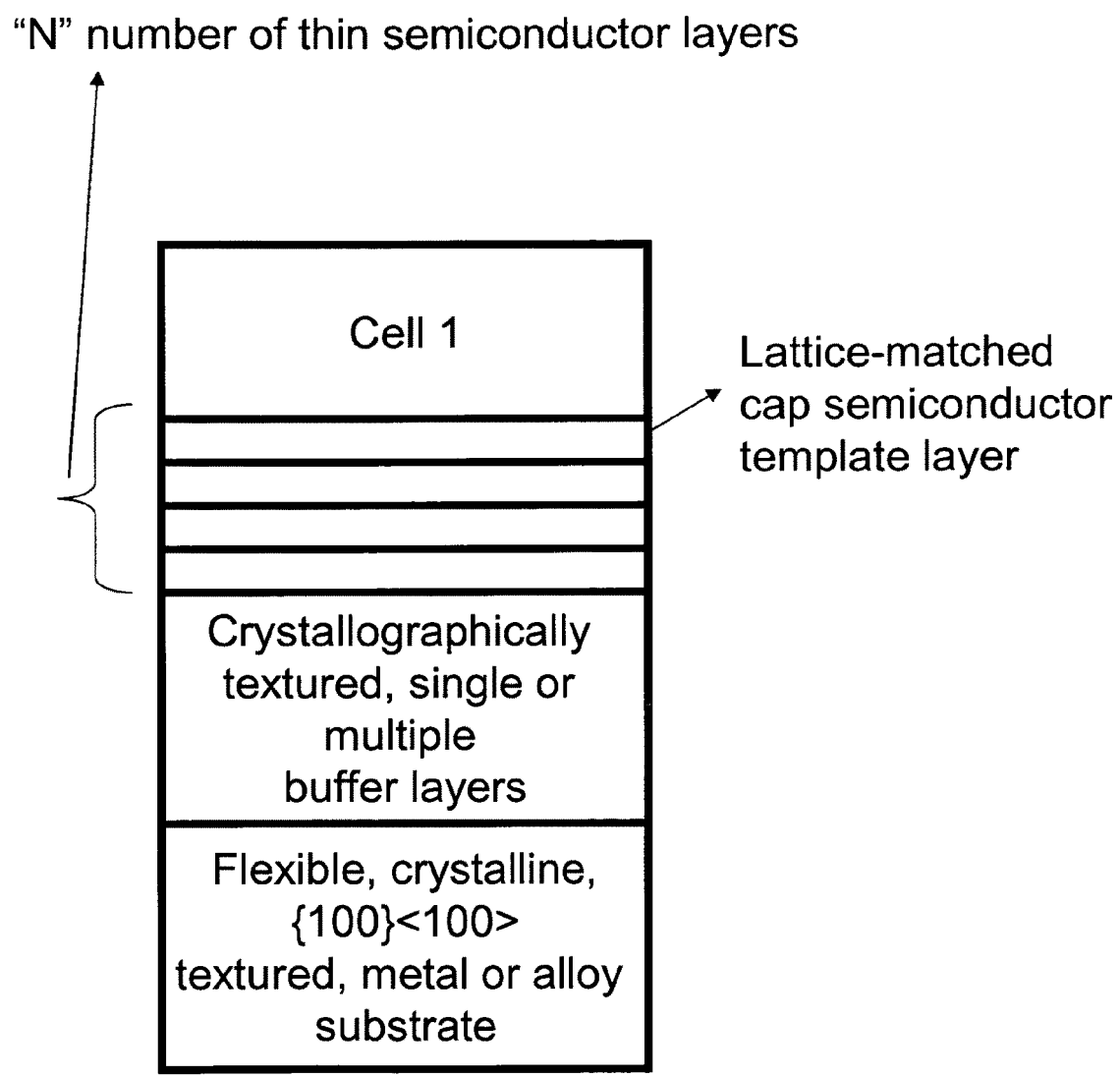
FIG. 8 shows an idealized schematic representation in cross-section of an electronic device as depicted in FIG. 1-7, with the semiconductor template layer comprised of a number of thin layers so as to provide a good lattice match to the semiconductor device layer or the first cell comprising the pn junction and grown on top of the semiconductor template layer. This is referred to as a "graded semiconductor approach" for providing a good lattice match to the semiconductor device layer to further minimize defect density in the semiconductor device layer.
Figure 9:
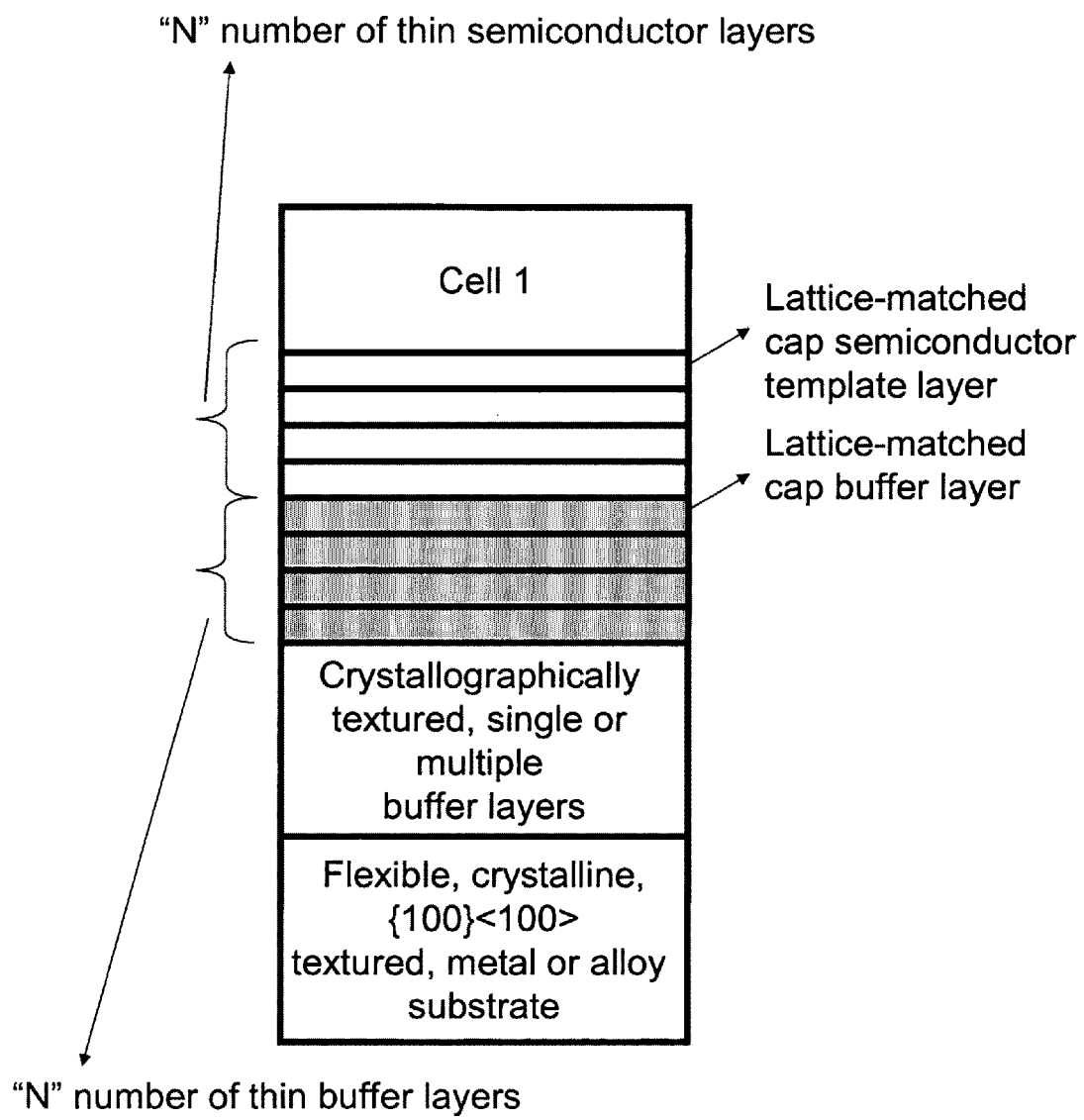
FIG. 9 shows an idealized schematic representation in cross-section of an electronic device as depicted in FIG. 1-8, with the buffer layer stack comprised of a number of thin buffer layers so as to provide a good lattice match to the semiconductor template layer grown on the top buffer template. In addition, the semiconductor template layer is comprised of a number of thin layers so as to provide a good lattice match to the semiconductor device layer or the first cell comprising the pn junction and grown on top of the semiconductor template layer. This referred to as a combination of the "graded buffer approach" and the "graded semiconductor approach" for providing a good lattice match to the semiconductor device layer to minimize defect density in the this layer.

In some cases, it is more desirable to use a "graded semiconductor template" approach to reduce the defect density in the active semiconductor layer comprising the electronic device. FIG. 8 shows an idealized schematic representation in cross-section of an electronic device as depicted in FIG. 1-7, with the semiconductor template layer comprised of a number of thin layers with gradually differing lattice parameters, so as to provide a good lattice match to the semiconductor device layer or the first cell comprising the pn junction and grown on top of the semiconductor template layer. This is referred to as a "graded semiconductor approach" for providing a good lattice match to the semiconductor device layer to further minimize defect density in the semiconductor device layer. In the final case, one can envision a combination of the "graded buffer layer" and the "graded semiconductor template" approach. FIG. 9 shows an idealized schematic representation in cross-section of an electronic device as depicted in FIG. 1-8, with the buffer layer stack comprised of a number of thin buffer layers so as to provide a good lattice match to the semiconductor template layer grown on the top buffer template. In addition, the semiconductor template layer is comprised of a number of thin layers so as to provide a good lattice match to the semiconductor device layer or the first cell comprising the pn junction and grown on top of the semiconductor template layer. This referred to as a combination of the "graded buffer approach" and the "graded semiconductor approach" for providing a good lattice match to the semiconductor device layer to minimize defect density in the this layer.

EXAMPLE 1

A [100], uniaxially textured, metallic substrate was prepared by successively pressing via compression or forging to large total deformations a cubic metal or alloy followed by recrystallization annealing. For example, a NiW alloy with 3-9 at % W was used compressed by 90% deformation in uniaxial compression followed by annealing in a furnace above the primary recrystallization temperature of the alloy. The primary recrystallization texture formed was a [100] texture. By increasing the annealing temperature to high temperatures close to 1000° C., an average grain size larger than 100 μm was formed. Epitaxial buffer layers are then deposited on the substrate. For example, an epitaxial TiN layer was deposited using chemical vapor deposition (CVD) at deposition temperatures in the temperature range of 300-600° C. This is then followed by deposition of an epitaxial Si layer at deposition temperatures in the range of 300-900° C. using a CVD-type process. This results in the formation of a [100], uniaxially textured, Si, device layer. Alternatively, by changing the deposition conditions of the Si layer, a [110] crystallographic texture is obtained as opposed to the [100] texture.

EXAMPLE 2

A [110], uniaxially textured, metallic substrate was prepared by successively pressing via compression to large total deformations a cubic metal or alloy followed by recrystallization annealing. For example, a NiW alloy with 3-9 at % W was used compressed by 90% deformation in uniaxial compression followed by annealing in a furnace above the primary recrystallization temperature of the alloy. The primary recrystallization texture formed was a [110] texture. By increasing the annealing temperature to high temperatures close to 1000° C., an average grain size larger than 100 μm was formed. Epitaxial buffer layers are then deposited on the substrate. For example, an epitaxial TiN layer was deposited using chemical vapor deposition (CVD) at deposition temperatures in the temperature range of 300-600° C. This is then followed by deposition of an epitaxial Si layer at deposition temperatures in the range of 300-900° C. using a CVD-type process. This results in the formation of a [110], uniaxially textured, Si, device layer. Alternatively, by changing the deposition conditions of the Si layer, a [100] crystallographic texture is obtained as opposed to the [100] texture.

EXAMPLE 3

Figure 10:
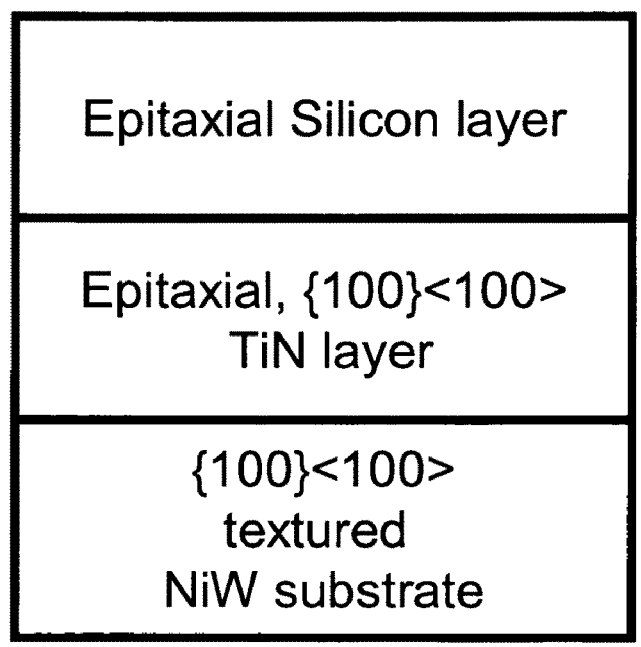
FIG. 10 shows an idealized schematic representation in cross-section of a {100}<100> textured, flexible NiW alloy with a textured Si semiconductor layer on top of it with an intervening textured epitaxial buffer layer of TiN.
Figure 11:
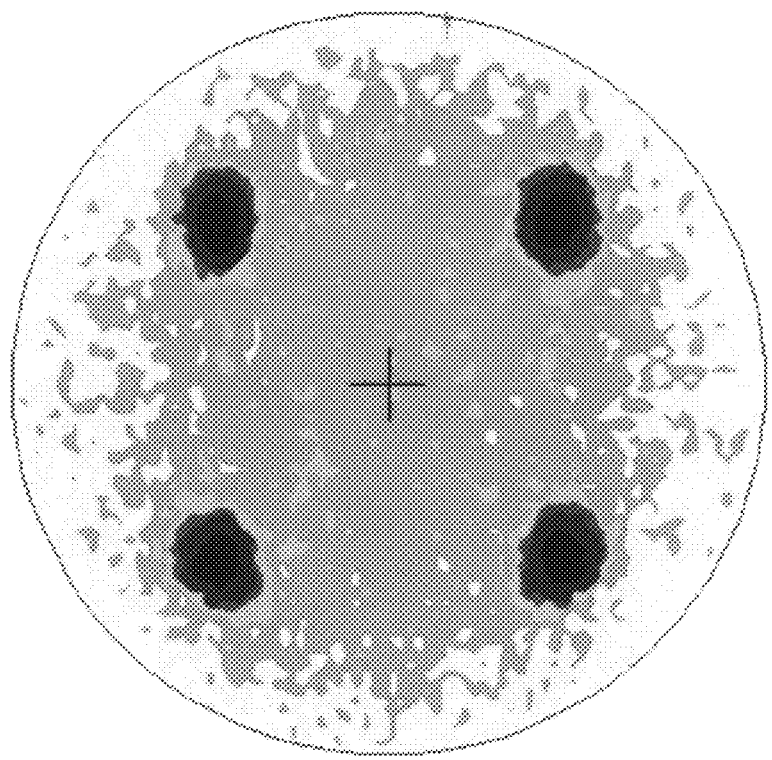
FIG. 11 shows a (111) X-ray pole figure of a sample of TiN grown epitaxially on a {100}<100> textured Ni-3 at % W substrate. Only four crystallographically equivalent peaks are seen implying a strong {100}<100> orientation. The full-width-half-maximum (FWHM) of the in-plane texture measured using the (111) phi-scan and the out-of-plane texture as measured by the (200) omega-scan using X-ray diffraction are also indicated on the figure.
Figure 12:
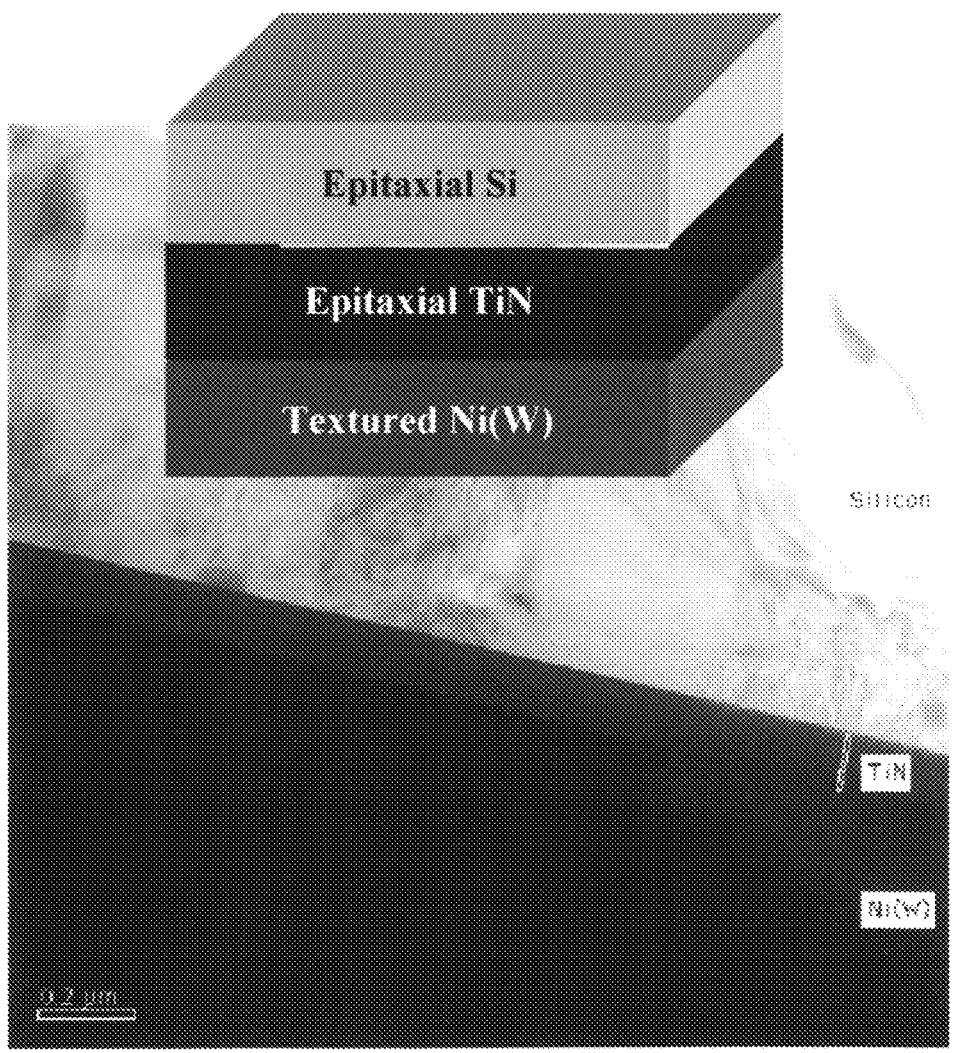
FIG. 12 shows a low-magnification TEM cross-section of a sample of Ni-3 at % W/TiN/Si. All three layers can clearly be distinguished in the micrograph.
Figure 14:
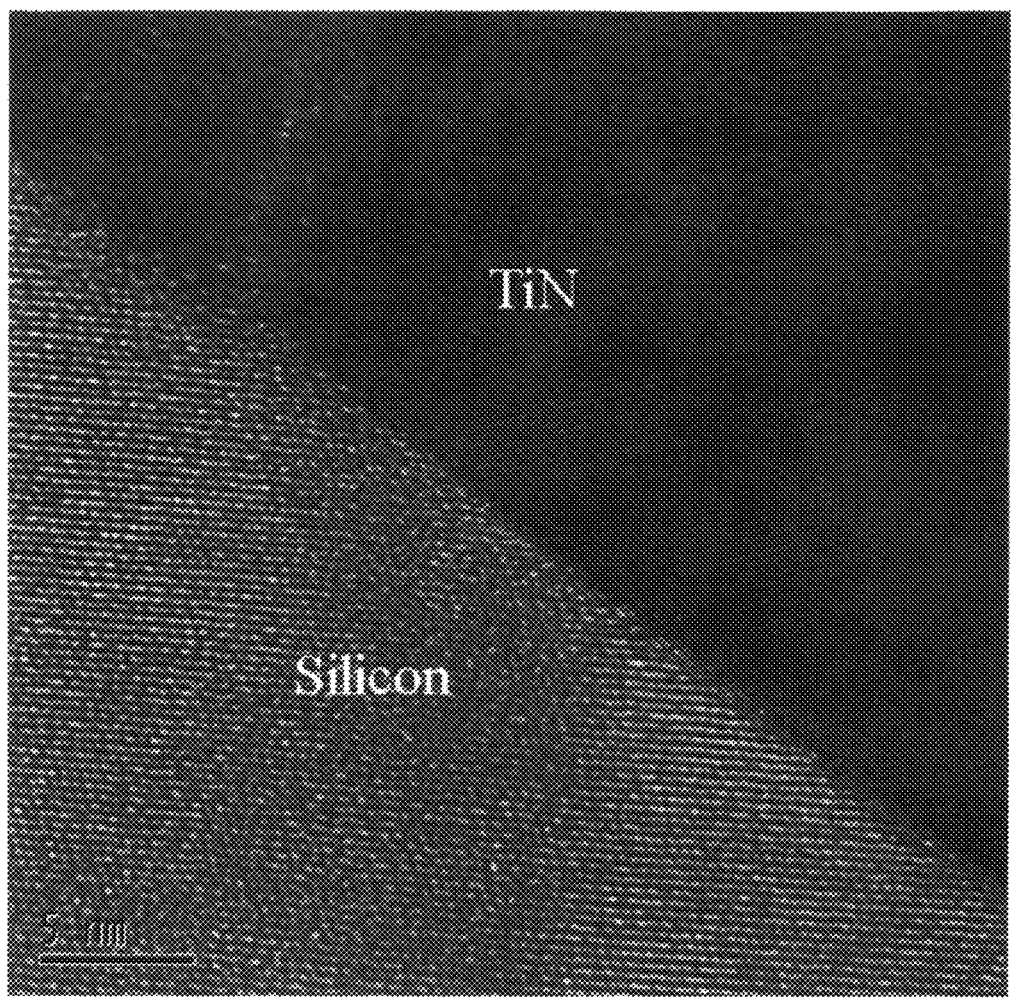
FIG. 14 shows a high resolution image of the Si/TiN interface showing epitaxial growth.
Figure 15:
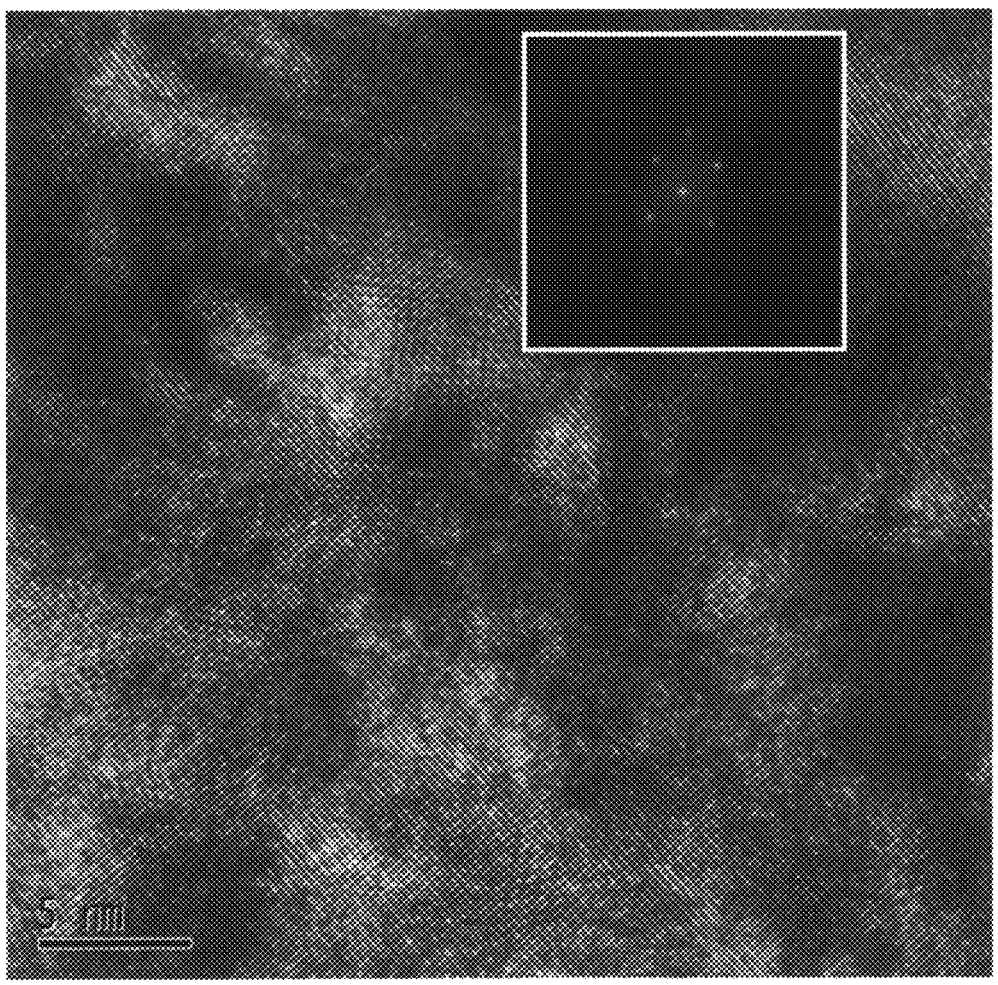
FIG. 15 shows a plan view, high-resolution, transmission electron micrograph of the epitaxial silicon layer along <100>. The inset shows a fast Fourier transform (FFT) pattern of the image.
Figure 16:
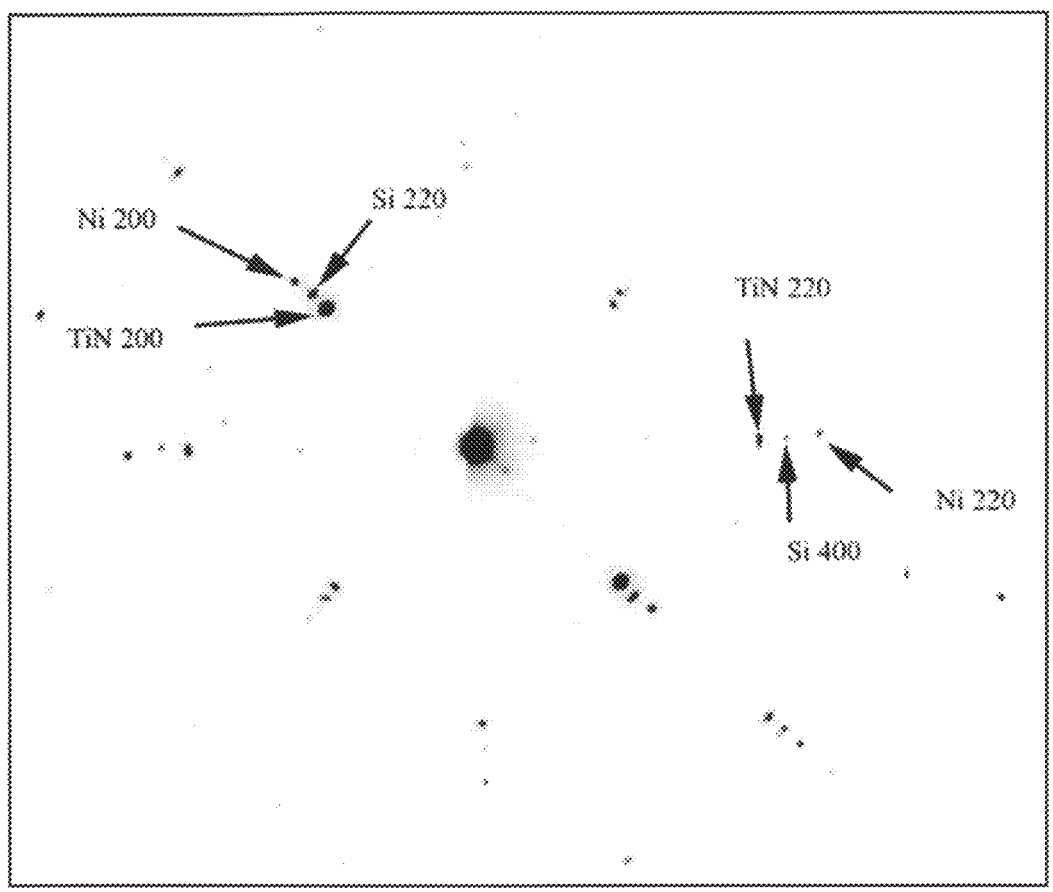
FIG. 16 shows a selected area diffraction pattern from the <100> zone axis of a plan view of transmission electron microscopy specimen of Si/TiN/NiW, showing epitaxial alignment of Si{220}, TiN{200} and Ni{200} diffraction spots.
Figure 17:
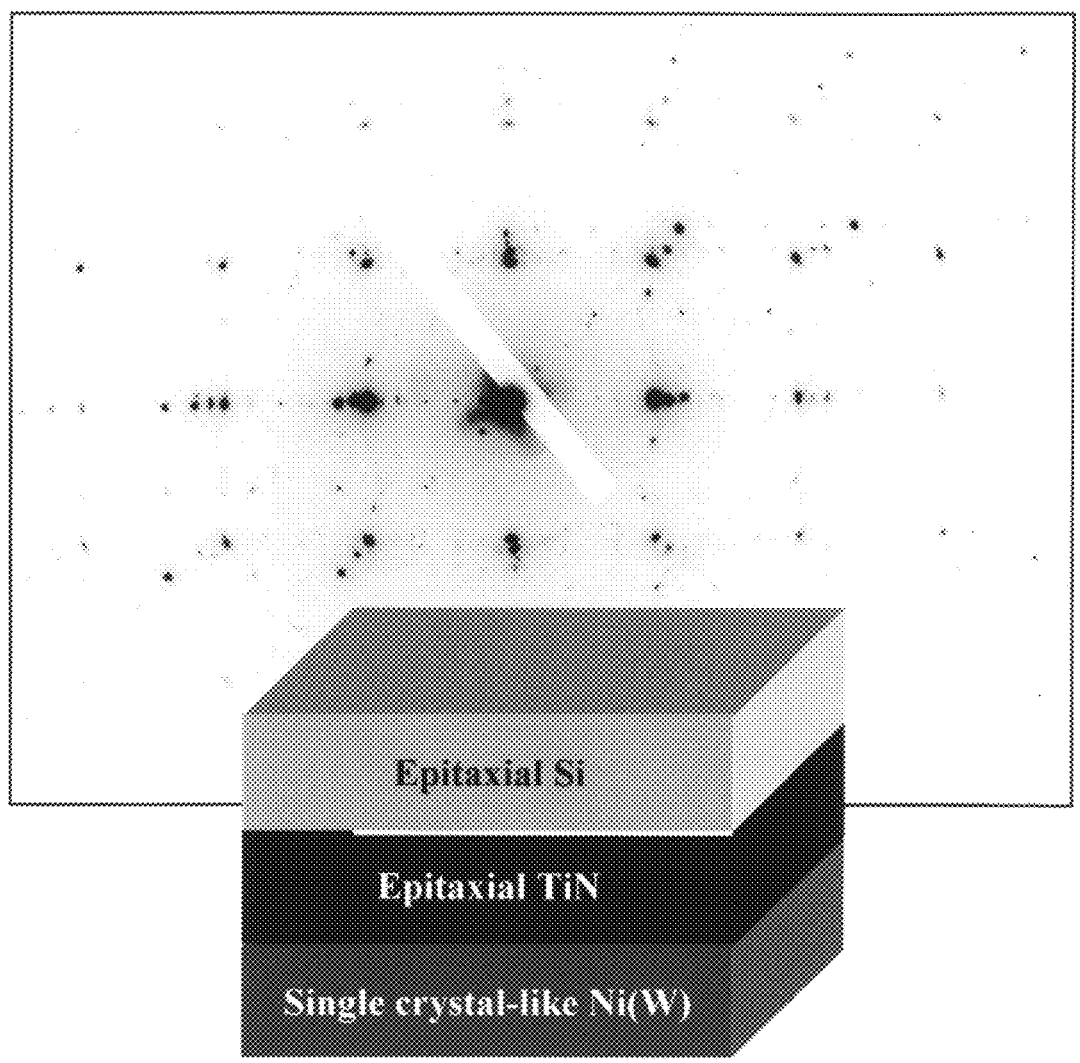
FIG. 17 also shows a selected area diffraction pattern from the <100> zone axis of a plan view of transmission electron microscopy specimen of Si/TiN/NiW, showing epitaxial alignment of Si{220}, TiN{200} and Ni{200} diffraction spots. In this case the region from where the diffraction pattern was obtained is larger.

Shown in FIG. 10 is an idealized schematic representation in cross-section of a crystallographically textured, flexible NiW alloy with a textured, epitaxial Si semiconductor layer on top of it with an intervening textured, epitaxial buffer layer of TiN. This device is consistent with the devices depicted in FIGS. 1A and B. [100] textured, biaxially textured Ni-3 at % W was prepared by successive rolling of a powder metallurgy derived alloy coil from about 120 mils to a foil of about 2 mils or 50 microns in thickness. As-rolled crystallographic texture of the foil or tape was the standard Cu-type rolling texture of heavily deformed FCC metals. After the tape was degreased and dried, it was loaded into a reel-to-reel high vacuum ($10^{-8}$ Torr) chamber, which contained a radio frequency induction heated furnace. The tape was pulled through the hot zone of the furnace at a rate that heated each part to 1250° C. for twenty minutes with a partial pressure of hydrogen sulfide gas of $\sim 3 \times 10^{-7}$ Torr in order to form a sulfur c(2×2) superstructure on the surface of the tape. After the high temperature anneal, the NiW tape is completely cube textured and has a sharp texture corresponding to the orientation, {100}<100>, and also has a surface reconstruction corresponding to a c(2× 2) sulfur superstructure. Both the TiN and Si layers were then epitaxially deposited on the NiW tape. The TiN was grown using a stoichiometric hot pressed TiN target. These films were deposited via pulsed laser ablation at 700° C. with a laser energy of about 2-3 J/cm$^2$ with a base pressure of 3×10$^{-8}$ Torr for 15 minutes and at a repetition rate of 10 Hz. FIG. 11 shows a typical (111) X-ray pole figure of a sample of TiN grown epitaxially on triaxially textured Ni-3 at % W substrate. Only four crystallographically equivalent peaks are seen implying a strong {100}<100> orientation. The full-width-half-maximum (FWHM) of the in-plane texture measured using the (111) phi-scan and the out-of-plane texture as measured by the (200) omega-scan using X-ray diffraction are also indicated on the figure. The in-plane texture FWHM is typically around 6.6° and the out-of-plane FWHM is 3.2° for rocking along the rolling direction of the substrate and 6.6° for rocking about the rolling direction. The "true" FWHM of the phi-scan after accounting for the width of the omega scans is about ~5°. Silicon films were then deposited on the TiN layer with a base vacuum of ~10$^{-7}$ Torr using KrF ($\lambda$=248 nm, $\tau$=25 ns) pulsed excimer laser with energy density 5-7 J-cm$^{-2}$. Initially during the Si deposition, for the first 2 minutes, the ablation rate was 2 Hz and the substrate temperature was in the range of 650-700° C. Subsequent to this, the temperature for growth was lowered to the temperature range of 520-550° C. and Si growth was performed for 15 minutes, at a repetition rate of 10 Hz. FIG. 12 shows a low-magnification TEM cross-section of a sample of Ni-3 at % W/TiN/Si. All three layers can clearly be distinguished in the micrograph. The TiN layer was about 110 nm thick and the Si film was about 1 μm thick. FIG. 13 shows an orientation image micrograph created from acquiring and indexing electron backscatter Kikuchi diffraction patterns on a hexagonal grid at a spacing of 0.6 microns. A given grey scale shading in FIG. 13A indicates an interconnected region with misorientations less than 2 degrees. A given grey scale shading in FIG. 13B indicates an interconnected region with misorientations less than 3 degrees. Clearly, the silicon layer is representative of a large single crystal with some mosaic. The mound like particles seen in the image are there because the film was grown using the pulsed laser ablation technique in which such particulate like features are known to form. Growing a film using electron beam evaporation or chemical vapor deposition would result in nice smooth films. FIG. 13 shows that epitaxial, high oriented, triaxially textured Si films can be deposited on traixially textured NiW/TiN substrates. FIG. 14 shows a high resolution cross-section image of the Si/TiN interface showing epitaxial growth. The micrograph clearly indicates the epitaxial nature of growth as well as the sharpness of the interface between TiN and Si layers. FIG. 15 shows a plan view, high-resolution, transmission electron micrograph of the epitaxial silicon layer taken along the <100> direction. The inset shows a fast Fourier transform (FFT) pattern of the image. Clearly an epitaxial Si film is growing on the TiN buffered NiW. FIG. 16 shows a selected area diffraction pattern from the <100> zone axis of a plan view of transmission electron microscopy specimen of Si/TiN/NiW, showing epitaxial alignment of Si{220}, TiN{200} and Ni{200} diffraction spots. Spots from all three layers are clearly evident and marked in the diffraction pattern. There is a rotation of 45° between the Si and TiN while TiN on Ni has a cube on cube, epitaxial relationship. FIG. 17 also shows a selected area diffraction pattern from the <100> zone axis of a plan view of transmission electron microscopy specimen of Si/TiN/NiW, showing epitaxial alignment of Si{220}, TiN{200} and Ni{200} diffraction spots. In this case the region from where the diffraction pattern was obtained is larger. While the Si in this case was deposited using pulsed laser ablation, there are a wide range of techniques available for Si deposition. Many of these have recently been reviewed (see for example, Michelle J. McCann, Kylie R. Catchpole, Klaus J. Weber, Andrew W. Blakers, "A review of thin-film crystalline silicon for solar cell applications. Part 1: Native substrates," Solar Energy Materials and Solar Cells, Vol. 68, Issue 2, May 2001, Pages 135-171; Kylie R. Catchpole, Michelle J. McCann, Klaus J. Weber and Andrew W. Blakers, "A review of thin-film crystalline silicon for solar cell applications. Part 2: Foreign substrates," Solar Energy Materials and Solar Cells, Vol. 68, Issue 2, May 2001, Pages 173-215). The techniques of electron-beam evaporation sputtering, ion-beam sputtering, chemical vapor deposition, metallorganic chemical vapor deposition, and combustion chemical vapor deposition are among the techniques that be used for deposition of the buffer and semiconductor layers.

It is also important to note that in case there were a single buffer layer or multiple buffer layers, reaction layers which are not crystallographically textured in the desirable orientation can form below the top buffer layer during deposition of subsequent layers. These do not affect the orientation of the device layer since there is a layer of suitably oriented buffer over it. In general, formation of a polycrystalline, crystallographically untextured, reaction layer can occur in a multilayer system as long as it forms after deposition of a suitably oriented layer above the layer in question is completed.

Some first order, coherent twin boundaries are present in the silicon layer. Hence, the Si layer is not completely free of defects. However, such coherent twin boundaries are not quite detrimental and are not electronically active (Hjemas, P. C., Lohne, O., Wandera, A., Tathgar, H. S., "The effect of grain orientations on the efficiency of multicrystalline solar cells," Solid State Phenonema, vol. 95-96, pp. 217-222, 2004; B. Cunningham, H. Strunk and D. G. Ast, "First and second order twin boundaries in edge defined film growth silicon ribbon, Appl. Phys. Lett., 40, pp. 237-239, 982). While no other defects were clearly observed in the films made, if other defects to nucleate, they can be passivated to become electrically inactive or very less detrimental electronically. Such defects which need passivation commonly occur in single crystal wafers and ribbons used for solar cell fabrication. There is numerous prior art which establishes that such defects can be passivated (M. Rinio, M. Kaes, G. Hahn and D. Borchert, "Hydrogen passivation of extended defects in multicrystalline silicon solar cells," Presented at the 21$^{st}$ European Photovoltaic Solar Energy Conference and Exhibition, Dresden, Germany, 4-8, 9, 2006; A. Ebong, M. Hilali, A. Rohtagi, D. Meier and D. S. Ruby, "Belt furnace gettering and passivation of n-web silicon for high-efficiency screen-printed front-surface field solar cells," Progress in Photovoltaics: Research and Applications, 9, pp. 327-332, 2001; C. H. Seager, D. J. Sharp and J. K. G. Panitz, "Passivation of grain boundaries in silicon," J. Vac. Sci. & tech., 20, pp. 430-435, 1982; N. H. Nickel, N. M. Johnson and W. B. Jackson, "Hydrigen passivation of grain boundary defects in polycrystalline silicon thin films," Appl. Phys. Lett., 62, pp. 3285-3287, 1993; A. Ashok, "Research in hydrogen passivation of defects and impurities in silicon," NREL Report No. NREL/SR-520-36096, May 2004; M. Lipinski, P. Panek, S. Kluska, P. Zieba, A. Szyszka and B. Paszkiewicz, "Defect passivation of multicrystalline silicon solar cells by silicon nitride coatings," Materials Science-Poland, vol. 24, pp. 1003-1007, 2006; V. Yelundur, "Understanding and implementation of hydrogen passivation of defects in string ribbon silicon for high-efficiency, manufacturable, silicon solar cells," Ph.D thesis, Georgia Institute of Technology, Atlanta, Ga., November 2003.)

While all kinds of uniaxial, biaxial or triaxial texture in a metal or alloy substrate is of interest, particular interest is in three kinds of crystallographic orientations. These include the {100}<100>, {110}<100> and the {210}<100> orientation. In all of these, the <100> direction is parallel to the long axis of the thermomechanically processed, rolled and recrystallized tape. The {100}<100> is produced by annealing above the primary recrystallization temperature of the metal or alloy. The {110}<100> and {210}<100> orientations are produced by annealing above the secondary recrystallization temperature of the metal or alloy. The {100}<100> orientation is readily produced in many face centered cubic metals and alloys such as Ni, Al, Cu based alloys. The {110}<100> texture is most readily produced in body centered cubic metals and alloys such Fe-based alloys. The {210}<100> orientation is readily produced in alloys such as Ni—Fe alloys. Thermomechanical processing to fabricate such textured substrates can be extended to fabricate long and wide substrates of arbitrary lengths.

A very large fraction of the Silicon wafers used in the photovoltaic industry worldwide are in the form of 8 inch wafers which are rejects from the electronic industry. These wafers which contain many defects are otherwise single crystal crystallographically and have an area of 50.2 square inches (50.2 $in^2$). Recently, the electronic fabrication shops worldwide have re-tooled to accommodate larger silicon wafers of 12 inch diameter. It is possible for the photovoltaic industry to use reject wafers containing defects which are 12 inch in diameter as well with an area of 113 $in^2$. However, this is the maximum possible size of single crystal wafers available and that can be grown world-wide. This invention allows one to fabricate flexible, large-area, single-crystal or single crystal-like semiconductor materials which are larger than 50.2 $in^2$ or 113.0 $in^2$. Textured metal and alloy substrates can be fabricated using thermomechanical processing to produce materials which have a {100}<100>, {110}<100> and the {210}<100> texture. In such cases, continuous sheets of large-area substrates can be made upon which epitaxial layers are deposited leading to a triaxially textured electronic device. Substrates of lengths exceeding 100 meters and widths approaching one meter are possible. Also, as taught previously, several methods of continuously producing single crystal or single grain metal and/or alloy substrates are possible.

In addition to texturing via the thermomechanical processing route, there are other known routes to fabrication of textured, flexible substrates such as ion-beam-assisted deposition (IBAD), inclined-substrate deposition (ISD) and deposition in the presence of a magnetic field. IBAD processes are described in U.S. Pat. Nos. 6,632,539, 6,214,772, 5,650,378, 5,872,080, 5,432,151, 6,361,598, 5,872,080, 6,190,752, 6,756,139, 6,884,527, 6,899,928, 6,921,741; ISD processes are described in U.S. Pat. Nos. 6,190,752 and 6,265,353; and biaxial texture by deposition in the presence of a magnetic field are described in U.S. Pat. No. 6,346,181; all these patents are incorporated herein by reference. Post-deposition ion-bombardment of uniaxially textured metal and/or alloy films on a unoriented, polycrystalline substrate can also result an in-plane texture via a selective grain growth process and in the extreme case the film can become triaxially textured. In all of these processes, a flexible, polycrystalline, untextured substrate or an amorphous substrate is used upon which buffer layers are deposited. One the key buffer layers is a biaxially textured layer that is deposited on this substrate using either IBAD, ISD or deposition in a magnetic field.

Once a textured buffer layer is grown, then the semiconductor layer is grown epitaxially on it. In each of the above cases, devices with areas greater than 113.0 $in^2$ can be grown which is not possible via single crystal growth of silicon or any other semiconductor.

FIG. 18 shows an idealized schematic representation in cross-section of various additional preferred embodiments of multilayer structures in accordance with the present invention and Example 1. FIG. 18A shows a flexible, crystalline, crystallographically textured metal or alloy substrate; a crystallographically textured TiN buffer layer on top of the substrate, and an epitaxial Si or other semiconductor device or template layer.

EXAMPLE 4

Starting with a biaxially textured, Ni-3 at % W substrate, a 10-75 nm thick, epitaxial layer of MgO is grown by electron beam evaporation, sputtering, pulsed laser ablation or chemical vapor deposition at a substrate temperature in the range of 300-850° C. This is followed by deposition of a 10-75 nm thick, epitaxial layer of TiN by electron beam evaporation, sputtering, pulsed laser ablation or chemical vapor deposition at a substrate temperature in the range of 300-850° C. This is followed by deposition of an epitaxial Si layer using chemical vapor deposition in the temperature range of 300-900° C. FIG. 18B shows a flexible, crystalline, crystallographically textured metal or alloy substrate; a crystallographically textured MgO buffer layer on top of the substrate; a crystallographically textured TiN buffer layer on top of the MgO layer; and an epitaxial Si or other semiconductor device or template layer.

EXAMPLE 5

Starting with a biaxially textured, Ni-3 at % W substrate, a 10-75 nm thick, epitaxial layer of $Y_2O_3$ is grown by electron beam evaporation, sputtering, pulsed laser ablation or chemical vapor deposition at a substrate temperature in the range of 300-850° C. This is followed by deposition of a 10-75 nm thick, epitaxial layer of YSZ by electron beam evaporation, sputtering, pulsed laser ablation or chemical vapor deposition at a substrate temperature in the range of 300-850° C. This is followed by deposition of a 10-75 nm thick, epitaxial layer of TiN by electron beam evaporation, sputtering, pulsed laser ablation or chemical vapor deposition at a substrate temperature in the range of 300-850° C. This is followed by deposition of an epitaxial Si layer using chemical vapor deposition in the temperature range of 300-900° C. FIG. 18C shows a flexible, crystalline, crystallographically textured metal or alloy substrate; a crystallographically textured $Y_2O_3$ buffer layer on top of the substrate; a crystallographically textured YSZ buffer layer on top of the $Y_2O_3$ layer; a crystallographically textured TiN buffer layer on top of the YSZ layer; and an epitaxial Si or other semiconductor device or template layer.

EXAMPLE 6

Starting with a biaxially textured, Ni-3 at % W substrate, a 10-75 nm thick, epitaxial layer of $Y_2O_3$ is grown by electron beam evaporation, sputtering, pulsed laser ablation or chemical vapor deposition at a substrate temperature in the range of 300-850° C. This is followed by deposition of a 10-75 nm thick, epitaxial layer of YSZ by electron beam evaporation, sputtering, pulsed laser ablation or chemical vapor deposition at a substrate temperature in the range of 300-850° C. This is followed by deposition of a 10-75 nm thick, epitaxial layer of MgO by electron beam evaporation, sputtering, pulsed laser ablation or chemical vapor deposition at a substrate temperature in the range of 300-850° C. This is followed by deposition of a 10-75 nm thick, epitaxial layer of TiN by electron beam evaporation, sputtering, pulsed laser ablation or chemical vapor deposition at a substrate temperature in the range of 300-850° C. This is followed by deposition of an epitaxial Si layer using chemical vapor deposition in the temperature range of 300-900° C. FIG. 18D shows a flexible, crystalline, crystallographically textured metal or alloy substrate; a crystallographically textured $Y_2O_3$ buffer layer on top of the substrate; a crystallographically textured YSZ buffer layer on top of the $Y_2O_3$ layer; a crystallographically textured MgO buffer layer on top of the YSZ layer; a crystallographically textured TiN buffer layer on top of the MgO layer; and an epitaxial Si or other semiconductor device or template layer. In each of the cases shown in FIG. 20, a nitride layer can form at the interface of the top buffer layer and the semiconductor device or template layer, such a Silicon nitride or a germanium nitride layer. This layer does not necessarily need to be textured or epitaxial.

FIG. 19 shows an additional idealized schematic representation in cross-section of various embodiments of multilayer structures in accordance with the present invention. FIG. 19A shows a flexible, crystalline, crystallographically textured metal or alloy substrate; at least one crystallographically textured, cubic nitride buffer layer on top of the substrate, and an epitaxial Si or other semiconductor device or template layer. FIG. 19B shows a flexible, crystalline, crystallographically textured metal or alloy substrate; a crystallographically textured MgO buffer layer on top of the substrate; at least one crystallographically textured, cubic nitride buffer layer on top of the MgO layer; and an epitaxial Si or other semiconductor device or template layer. FIG. 19C shows a flexible, crystalline, crystallographically textured metal or alloy substrate; a crystallographically textured $Y_2O_3$ buffer layer on top of the substrate; a crystallographically textured YSZ buffer layer on top of the $Y_2O_3$ layer; at least one crystallographically textured, cubic nitride buffer layer on top of the YSZ layer; and an epitaxial Si or other semiconductor device or template layer. FIG. 19D shows a flexible, crystalline, crystallographically textured metal or alloy substrate; a crystallographically textured $Y_2O_3$ buffer layer on top of the substrate; a crystallographically textured YSZ buffer layer on top of the $Y_2O_3$ layer; a crystallographically textured MgO buffer layer on top of the YSZ layer; at least one crystallographically textured, cubic nitride buffer layer on top of the MgO layer; and an epitaxial Si or other semiconductor device or template layer. In each of the cases shown in FIG. 19, a nitride layer can form at the interface of the top buffer layer and the semiconductor device or template layer, such a Silicon nitride or a germanium nitride layer. This layer does not necessarily need to be textured or epitaxial.

EXAMPLE 7

Starting with a biaxially textured, Ni-3 at % W substrate, a 10-75 nm thick, epitaxial layer of $\gamma$-$Al_2O_3$ is grown by electron beam evaporation, sputtering, pulsed laser ablation or chemical vapor deposition at a substrate temperature in the range of 300-850° C. This is followed by deposition of an epitaxial Si layer using chemical vapor deposition in the temperature range of 300-900° C. Numerous reports exist in the literature of epitaxial growth of Si on $\gamma$-$Al_2O_3$ (see for example, Liwen tan, Qiyuan Wang, Jun Wang, Yuanhuan Yu, Zhongli Liu and Lanying Lin, "Fabrication of novel double-hetero-epitaxial SOI structure Si/$\gamma$-$Al_2O_3$/Si," Journal of Crystal Growth, vol. 247, pp. 255-260, 2003; K. Sawada, M. Ishida, T. Nakamura and N. Ohtake, "Metalorganic molecular beam epitaxy of films on Si at low growth temperatures," Appl. Phys. Lett., vol. 52, pp. 1672-1674, 1988; M. Shahjahan, Y. Koji, K. Sawada and M. Ishida, "Fabrication of resonance tunnel diode by gamma-Al2O3/Si multiple heterostructures," Japan. J. of Appl. Phys. Part 1, vol. 41 (4B), pp. 2602-2605, 2002). FIG. 20 shows an idealized schematic representation in cross-section of various embodiments of multilayer structures in accordance with the present invention and this example. FIG. 20A shows a flexible, crystalline, crystallographically textured metal or alloy substrate; a crystallographically textured $\gamma$-$Al_2O_3$ buffer layer on top of the substrate, and an epitaxial Si or other semiconductor device or template layer.

EXAMPLE 8

Starting with a biaxially textured, Ni-3 at % W substrate, a 10-75 nm thick MgO or TiN layer is deposited epitaxially on NiW substrate using electron beam evaporation, sputtering, pulsed laser ablation or chemical vapor deposition at a substrate temperature in the range of 300-700° C. This is followed by deposition of a 10-75 nm thick, epitaxial layer of $\gamma$-$Al_2O_3$ by electron beam evaporation, sputtering, pulsed laser ablation or chemical vapor deposition at a substrate temperature in the range of 300-850° C. This is followed by deposition of an epitaxial Si layer using chemical vapor deposition in the temperature range of 300-900° C. FIG. 20B shows schematic representation in accordance with this invention and example. FIG. 20B shows a flexible, crystalline, crystallographically textured metal or alloy substrate; a crystallographically textured MgO buffer layer on top of the substrate; a crystallographically textured $\gamma$-$Al_2O_3$ buffer layer on top of the MgO layer; and an epitaxial Si or other semiconductor device or template layer.

EXAMPLE 9

Starting with a biaxially textured, Ni-3 at % W substrate, a 10-75 nm thick $Y_2O_3$ layer is deposited epitaxially on NiW substrate using electron beam evaporation, sputtering, pulsed laser ablation or chemical vapor deposition at a substrate temperature in the range of 300-700° C. This is followed by deposition of a 10-75 nm thick, epitaxial layer of YSZ by electron beam evaporation, sputtering, pulsed laser ablation or chemical vapor deposition at a substrate temperature in the range of 300-850° C. This is followed by deposition of a 10-75 nm thick, epitaxial layer of $\gamma$-$Al_2O_3$ by electron beam evaporation or sputtering or pulsed laser deposition at a substrate temperature in the range of 300-850° C. This is followed by deposition of an epitaxial Si layer using chemical vapor deposition in the temperature range of 500-900° C. FIG. 20C shows schematic representation in accordance with this invention and example. FIG. 20C shows a flexible, crystalline, crystallographically textured metal or alloy substrate; a crystallographically textured $Y_2O_3$ buffer layer on top of the substrate; a crystallographically textured YSZ buffer layer on top of the $Y_2O_3$ layer; a crystallographically textured $\gamma$-$Al_2O_3$ buffer layer on top of the YSZ layer; and an epitaxial Si or other semiconductor device or template layer.

EXAMPLE 10

Starting with a biaxially textured, Ni-3 at % W substrate, a 10-75 nm thick $Y_2O_3$ layer is deposited epitaxially on NiW substrate using electron beam evaporation, sputtering, pulsed laser ablation or chemical vapor deposition at a substrate temperature in the range of 300-700° C. This is followed by deposition of a 10-75 nm thick, epitaxial layer, of YSZ by electron beam evaporation, sputtering, pulsed laser ablation or chemical vapor deposition at a substrate temperature in the range of 300-850° C. This is followed by deposition of a 10-75 nm thick, epitaxial layer, of MgO by electron beam evaporation, sputtering, pulsed laser ablation or chemical vapor deposition at a substrate temperature in the range of 300-850° C. This is followed by deposition of a 10-75 nm thick, epitaxial layer of $\gamma$-$Al_2O_3$ by electron beam evaporation, sputtering, pulsed laser ablation or chemical vapor deposition at a substrate temperature in the range of 300-850° C. This is followed by deposition of an epitaxial Si layer using chemical vapor deposition in the temperature range of 300-900° C. FIG. 20D shows schematic representation in accordance with this invention and example. FIG. 20D shows a flexible, crystalline, crystallographically textured metal or alloy substrate; a crystallographically textured $Y_2O_3$ buffer layer on top of the substrate; a crystallographically textured YSZ buffer layer on top of the $Y_2O_3$ layer; a crystallographically textured MgO buffer layer on top of the YSZ layer; a crystallographically textured $\gamma$-$Al_2O_3$ buffer layer on top of the MgO layer; and an epitaxial Si or other semiconductor device or template layer. FIG. 21 shows a similar configuration as in FIG. 20, with the exception that instead of the $\gamma$-$Al_2O_3$ buffer layer, any other cubic oxide can be used. This cubic oxide layer can also be graded oxide layer to provide a better lattice match to the epitaxial semiconductor layer.

EXAMPLE 11

Figure 22:
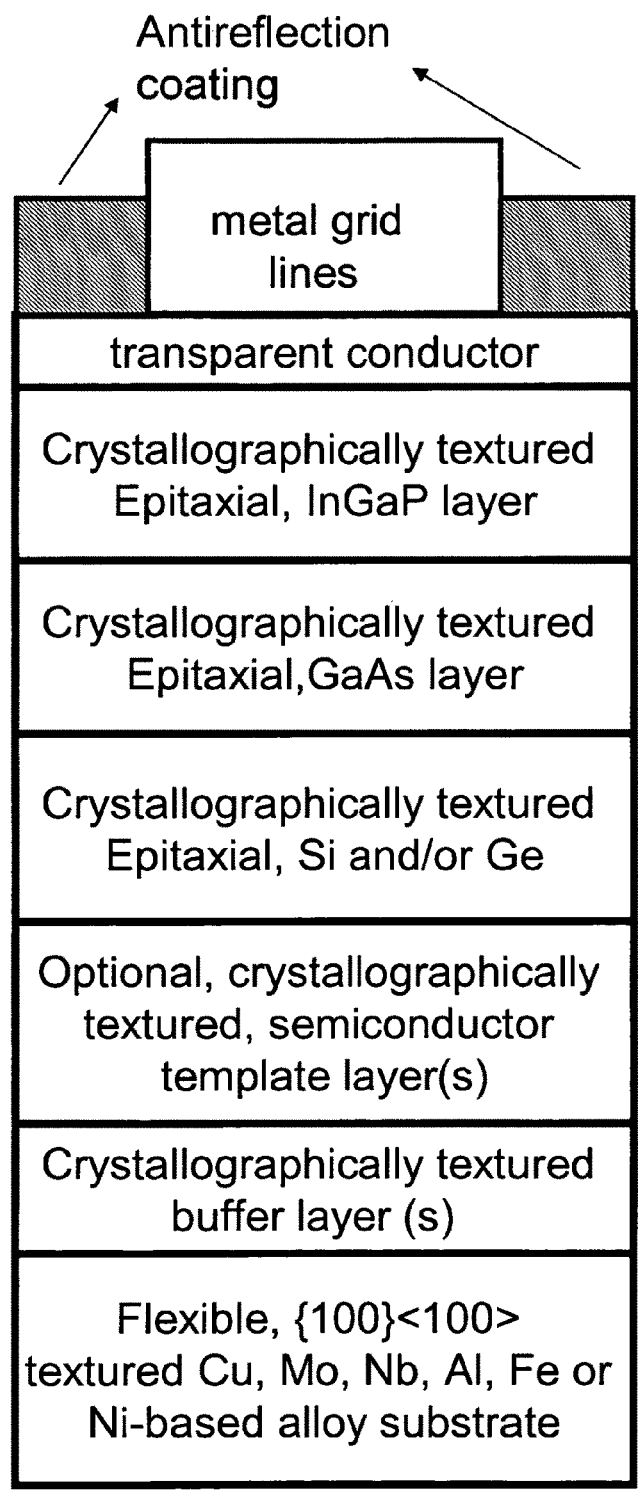
FIG. 22 shows an idealized schematic representation in cross-section of an electronic device containing a crystallographically textured semiconductor device in accordance with the present invention. The device comprises a flexible, {100><100> textured metal/alloy Cu, Mo, Nb, Al, Fe or Ni-based alloy substrate; crystallographically textured buffer layers; an optional crystallographically textured semiconductor template layer; a crystallographically textured, epitaxial layer of Si and/or Ge; a crystallographically textured, epitaxial GaAs layer; a crystallographically textured, epitaxial InGaP layer; a transparent conductor layer, and optional anti-reflection coating and metal grid lines. The representation forms the general basis of a device. One can envisage additional semiconductor layers or junctions and/or buffer layers in this multilayered stack. One use of such a device is for solar power generation.

Starting with the experimental procedure of Examples 1-10, a Germanium (Ge) or a Si deposited upon the top buffer layer or the optional semiconductor template layer. This is followed by deposition of an epitaxial GaAs layer by chemical vapor deposition. This is then followed by deposition of an epitaxial InGaP layer. A transparent conductor is then deposited, followed by deposition of an antireflection coating and metal grid lines. The device shown schematically in FIG. 22 is now fabricated. The purpose to fabricate such a multijunction device has been discussed previously in FIGS. 4 and 5 and the goal is to increase the photovoltaic conversion efficiency by capturing a greater portion of the sun's spectrum. The substrate with the buffer layers and the optional textured semiconductor template layer can be prepared according to the teachings in Examples 1-10. During the fabrication of the device shown in this example, an untextured or textured reaction layer can form at the interface of the top buffer layer to form a nitride or an oxide with the semiconductor such as silicon nitride or silicon oxide layer.

EXAMPLE 12

Starting with a polycrystalline, flexible Ni-alloy substrate with a smooth and clean surface (surfaces of substrates can be cleaned and made smoother by chemical etching and/or planarization, reactive ion etching, mechanical polishing or by electropolishing), a crystallographically textured MgO layer is deposited by electron beam evaporation using inclined substrate deposition (ISD). Optional amorphous or polycrystalline layers can be deposited before depositing the MgO layer via the inclined substrate deposition technique. During ISD, the substrate is inclined at an angle of 25°-30° towards the MgO vapor during deposition. High deposition rates >3 nm/s are used. Growth selection by shadowing results in only MgO grains with good in plane alignment and a surface tilt of about 20°. Upon this MgO layer a TiN layer is deposited using sputtering. This is followed by deposition of an epitaxial silicon layer. For further buffer layer combinations, the teachings in Examples 1-11 are valid.

EXAMPLE 13

Starting with the experimental procedure of Example 10, a Germanium (Ge) layer is deposited upon the epitaxial Si layer. This is followed by deposition of an epitaxial GaAs layer by chemical vapor deposition. This is then followed by deposition of an epitaxial InGaP layer. A transparent conductor is then deposited, followed by deposition of an antireflection coating and metal grid lines.

EXAMPLE 14

Starting with a polycrystalline, flexible Ni-alloy substrate with a smooth and clean surface (surfaces of substrates can be cleaned and made smoother by chemical etching and/or planarization, reactive ion etching, mechanical polishing or by electropolishing), a crystallographically textured MgO layer is deposited by electron beam evaporation using inclined substrate deposition (ISD). Optional amorphous or polycrystalline layers can be deposited before depositing the MgO layer via the inclined substrate deposition technique. During ISD, the substrate is inclined at an angle of 25°-30° towards the MgO vapor during deposition. High deposition rates >3 nm/s are used. Growth selection by shadowing results in only MgO grains with good in plane alignment and a surface tilt of about 20°. Upon this MgO layer a 50 nm thick, epitaxial layer of $\gamma$-$Al_2O_3$ is deposited using electron beam evaporation at a substrate temperature in the range of 700-850° C. This is followed by deposition of an epitaxial silicon layer.

EXAMPLE 15

Starting with the experimental procedure of Example 14, a Germanium (Ge) layer is deposited upon the epitaxial Si layer. This is followed by deposition of an epitaxial GaAs layer by chemical vapor deposition. This is then followed by deposition of an epitaxial InGaP layer. A transparent conductor is then deposited, followed by deposition of an antireflection coating and metal grid lines.

EXAMPLE 16

Starting with a polycrystalline, flexible Ni-alloy substrate with a smooth and clean surface (surfaces of substrates can be cleaned and made smoother by chemical etching and/or planarization by deposition of amorphous layers, reactive ion etching, mechanical polishing or by electropolishing), a crystallographically textured MgO layer is deposited by electron beam evaporation or sputtering using ion-beam assisted deposition (IBAD) using the process taught in U.S. Pat. No. 6,190,752. Optional amorphous or polycrystalline layers can be deposited before depositing the MgO layer via the IBAD technique. A TiN layer is then deposited directly on this ion-assist deposited layer using sputtering, evaporation or chemical vapor deposition. This is followed by deposition of an epitaxial silicon layer.

EXAMPLE 17

Starting with the experimental procedure of Example 16, a Germanium (Ge) layer is deposited upon the epitaxial Si layer. This is followed by deposition of an epitaxial GaAs layer by chemical vapor deposition. This is then followed by deposition of an epitaxial InGaP layer. A transparent conductor is then deposited, followed by deposition of an antireflection coating and metal grid lines.

EXAMPLE 18

Starting with a polycrystalline, flexible Ni-alloy substrate with a smooth and clean surface (surfaces of substrates can be cleaned and made smoother by chemical etching and/or planarization, reactive ion etching, mechanical polishing or by electropolishing), a crystallographically textured TiN layer is deposited by electron beam evaporation using ion-beam assisted deposition (IBAD) using the process taught in R. Hühne, S. Fähler, B. Holzapfel, "Thin biaxially textured TiN films on amorphous substrates prepared by ion-beam assisted pulsed laser deposition," Appl. Phys. Lett., vol. 85, pp. 2744-2746, 2004. Optional deposition of homoepitaxial TiN without using the ion-assist is then done. Optional amorphous or polycrystalline layers can be deposited before depositing the MgO layer via the IBAD technique. This is followed by deposition of an epitaxial silicon layer.

EXAMPLE 19

Starting with the experimental procedure of Example 18, a Germanium (Ge) layer is deposited upon the epitaxial Si layer. This is followed by deposition of an epitaxial GaAs layer by chemical vapor deposition. This is then followed by deposition of an epitaxial InGaP layer. A transparent conductor is then deposited, followed by deposition of an antireflection coating and metal grid lines.

EXAMPLE 20

Starting with the teaching in Example 1, a heterostructure of NiW/TiN/Si is formed. A graded semiconductor template layer of Si—Ge is then deposited upon the Si layer. There is a 4% lattice mismatch between silicon and germanium. This puts enormous stress on a Ge film if deposited directly by epitaxial deposition on the Si layer and can cause many crystalline defects to appear. Hence, as the Si—Ge layer grows, the content of germanium is gradually increased to more or less pure Ge. The Ge layer provides an excellent lattice match for growth of GaAs. The graded semiconductor template approach also reduces thermal expansion mismatch between the top semiconductor template layer and the semiconductor device layer.

EXAMPLE 21

Starting with the teaching in Example 1, a heterostructure of NiW/TiN is formed. A compositionally graded nitride layer is then deposited to form a good lattice match in the top layer with Silicon. Si is then epitaxially deposited on the "graded buffer layer". A graded semiconductor template layer of Si—Ge is then deposited upon the Si layer. There is a 4% lattice mismatch between silicon and germanium. This puts enormous stress on a Ge film if deposited directly by epitaxial deposition on the Si layer and can cause many crystalline defects to appear. Hence, as the Si—Ge layer grows, the content of germanium is gradually increased to more or less pure Ge. The Ge layer provides an excellent lattice match for growth of GaAs. The graded semiconductor template approach also reduces thermal expansion mismatch between the top semiconductor template layer and the semiconductor device layer.

EXAMPLE 22

Starting with a biaxially textured, Ni-3 at % W substrate, a 10-75 nm thick $Y_2O_3$ layer is deposited epitaxially on NiW substrate using electron beam evaporation, sputtering or chemical vapor deposition at a substrate temperature in the range of 300-700° C. This is followed by deposition of a 10-75 nm thick, epitaxial layer of cubic SiC or β-SiC using chemical vapor deposition following the procedure of Jin-Hyo Boo, S. A. Ustin and W. Ho, "Supersonic jet epitaxy of single crystalline cubic SiC thin films on Si substrates from t-Butyldimethylsilane," Thin solid Films, vol. 324, pp. 124-128, 1998. This is followed by deposition of an epitaxial Si layer using chemical vapor deposition in the temperature range of 300-900° C.

While GaAs layers can be integrated with large area, flexible substrates as described previously, GaAs can also be grown directly on perovskite oxides such as $SrTiO_3$ (see for example, K. Eisenbeiser, R. Emrick, R. Droopad, Z. Yu, J. Finder, S. Rockwell, J. Holmes, C. Overgaard, and W. Ooms, "GaAs MESFETs Fabricated on Si Substrates Using a $SrTiO_3$ Buffer Layer," IEEE Electron Device Letters, Vol. 23, No. 6, pp. 300-302, 2002; Droopad R, Yu Z Y, Li H, Liang Y, Overgaard C, Demkov A, Zhang X D, Moore K, Eisenbeiser K, Hu M, Curless J, Finder J, "Development of integrated hetero structures on silicon by MBE," Journal of Crystal Growth, vol. 251 (1-4), pp. 638-644, 2003). In this work a compliant substrate for the epitaxial growth of compound semiconductors such as GaAs is reported. Perovskite-type buffer layers such as $SrTiO_3$ are first grown epitaxially on a Si single crystal wafer. After growth, a thin amorphous layer of $SiO_2$ about 20 angstroms in thickness is formed between the $SrTiO_3$ layer and the Si substrate. This thin amorphous layer acts as an elastic membrane mechanically decoupled from the Si substrate. If the $SrTiO_3$ layer is also kept thin to about 50 Angstroms, the final mismatch between the GaAs layer and Si is much lower than 4% if GaAs is grown directly on Si. This of course results in higher quality GaAs layer with fewer defects.

EXAMPLE 23

Starting with a biaxially textured, Ni-3 at % W substrate, a 10-75 nm thick $Y_2O_3$ layer is deposited epitaxially on NiW substrate using electron beam evaporation, sputtering or chemical vapor deposition at a substrate temperature in the range of 300-700° C. This was followed by epitaxial deposition of a 100 nm thick $SrTiO_3$ layer on the $Y_2O_3$ Layer using rf-sputtering at a substrate deposition temperature of 300-700° C. A GaAs layer is then deposited heteroepitaxially on the $SrTiO_3$ layer using molecular beam epitaxy (MBE) using the procedure outlined in K. Eisenbeiser, R. Emrick, R. Droopad, Z. Yu, J. Finder, S. Rockwell, J. Holmes, C. Overgaard, and W. Ooms, "GaAs MESFETs Fabricated on Si Substrates Using a $SrTiO_3$ Buffer Layer," IEEE Electron Device Letters, Vol. 23, No. 6, pp. 300-302, 2002 and in Droopad R, Yu Z Y, Li H, Liang Y, Overgaard C, Demkov A, Zhang X D, Moore K, Eisenbeiser K, Hu M, Curless J, Finder J, "Development of integrated hetero structures on silicon by MBE," Journal of Crystal Growth, vol. 251 (1-4), pp. 638-644, 2003.

EXAMPLE 24

Starting with a polycrystalline, flexible Ni-alloy substrate with a smooth and clean surface (surfaces of substrates can be cleaned and made smoother by chemical etching and/or planarization, reactive ion etching, mechanical polishing or by electropolishing), a 50 nm thick $SiO_2$ layer is deposited using magnetron sputtering at room temperature. A uniaxially textured gold thin film is then deposited under high vacuum conditions. Before deposition of the gold film, the surface of the SiO$_2$ layer is cleaned with 1 keV Ar+ bombardment for 1 min resulting in a strong (111) fiber texture in the gold film. The gold thin film is then irradiated with 1.0-3.5 MeV N+, Ne+ and Ar+ ions with the ion beam direction at an angle of 35.24 to the surface normal. An ion fluence of $10^{17}$ ions/cm$^2$ and target currents in the range of 10-100 nA range were used depending upon the ion species. The temperature during the irradiation was kept at liquid nitrogen temperature. After this procedure the gold film exhibited texture in all directions. The procedure used to fabricate single-crystal-like gold films is outlined in more detail in prior work (Olliges S, Gruber P, Bardill A, Ehrler D, Carstanjen H D and Spolenak R, "Converting polycrystals into single crystals—Selective grain growth by high-energy ion bombardment," Acta Meterialia, vol. 54, pp. 5393-5399). Upon this gold film, a TiN layer was then epitaxially deposited by reactive sputtering followed by epitaxial deposition of a Si layer via CVD. This results in a crystallographically textured semiconductor layer on a polycrystalline substrate.

Another suitable substrate upon which multilayers including buffer layers and the semiconductor device layer(s) can be epitaxially deposited to result in high performance is a substrate which is uniaxially textured but has a large average grain size. For example, it is well known that simply via uniaxial compression, a very sharp uniaxial texture can be obtained in a range of metals and alloys. The uniaxial texture is such that the axis perpendicular to the substrate is aligned for all the grains. If the average grain size is now increased by annealing and/or abnormal grain growth, the average grain size can be come very large and over 100 microns in diameter. As long as the grain size is larger than the recombination length of the semiconductor, the semiconductor layer will essentially not be affected by the grain boundaries propagated from the substrate into the semiconductor layer. A strong uniaxial texture with a large grain size can also be imparted in a buffer layer when the substrate itself is unoriented and polycrystalline or amorphous. This can be done by abnormal grain growth (for example, refer to prior art—J. M. E. Harper, J. Gupta, D. A. Smith, J. W. Chang, K. L. Holloway, D. P. Tracey and D. B. Knorr, "Crystallographic texture change during abnormal grain growth in Cu—Co thin films," Appl. Phys. Lett, vol. 65, pp. 177-179, 1994) or grain growth via ion bombardment (for example, refer to prior art—T. Ohmi, T. Saito, M. Otsuki, T. Shibuta and T. Nitta, "Formation of copper thin films by a low kinetic energy particle process," J. of Electrochemical Soc., vol. 138, pp. 1089-1097, 1991). In all these cases, the device effectively has a "local" triaxial texture with a large grain size. This local biaxial texture on a length-scale larger than the recombination length of the semiconductor used to fabricate the polycrystalline device layer, will result in a photovoltaic cell of similar efficiency as that which is essentially single crystal, since the grain boundaries will not affect the performance.

Deposition of semiconductor layers can be done using a range of techniques. Many of these have recently been reviewed (see for example, Michelle J. McCann, Kylie R. Catchpole, Klaus J. Weber, Andrew W. Blakers, "A review of thin-film crystalline silicon for solar cell applications. Part 1: Native substrates," Solar Energy Materials and Solar Cells, Vol. 68, Issue 2, May 2001, Pages 135-171; Kylie R. Catchpole, Michelle J. McCann, Klaus J. Weber and Andrew W. Blakers, "A review of thin-film crystalline silicon for solar cell applications. Part 2: Foreign substrates," Solar Energy Materials and Solar Cells, Vol. 68, Issue 2, May 2001, Pages 173-215). In addition, there is interest in any low-temperature deposition technique as well since this will further reduce interdiffusion of elements from the metal/alloy substrate to the semiconductor device layer. Many low temperature deposition techniques for Si have been explored (see for example, Lars Oberbeck, Jan Schmidt, Thomas A. Wagner and Ralf B. Bergman, "High rate deposition of epitaxial layers for efficient low-temperature thin film epitaxial silicon solar cells," Progress in Photovoltaics: Research and Applications, vol. 9, pp. 333-340, 2001; J. Carabe and J. J. Gandia, "Thin-film-silicon Solar Cells," OPTO-Electronics Review, vol. 12, pp. 1-6, 2004; S Summers, H S Reehal and G H Shirkoohi, "The effects of varying plasma parameters on silicon thin film growth by ECR plasma CVD," J. Phys. D: Appl. Phys. Vol. 34, pp. 2782-2791, 2001; Thomas A. Wagner, Ph.D thesis, "Low temperature silicon epitaxy: Defects and electronic properties," Institut fur Physikalische Elektronik der Universit at Stuttgart, 2003; Hattangady, S. V., Posthill, J. B., Fountain, G. G., Rudder R. A., Mantini and M. J., Markunas, R. J., "Epitaxial silicon deposition at 300° C. with remote plasma processing using SiH$_4$/H$_2$ mixtures," Appl. Phys. Lett., vol. 59(3), pp. 339-341, 1991; Wagner, T. A., Oberbeck, L., and Bergmann, R. B., "Low temperature epitaxial silicon films deposited by ion-assisted deposition," Materials Science & Engineering B-Solid State Materials for Advanced Technology, vol. 89, pp. 1-3, 2002; Overbeck, L., Schmidt, J., Wagner, T. A., and Bergmann R. B., "High-rate deposition of epitaxial layers for efficient low-temperature thin film epitaxial silicon solar cells," Progress in Photovoltaics, vol. 9(5), pp. 333-340, 2001; Thiesen, J., Iwaniczko, E., Jones, K. M., Mahan, A., and Crandall, R., "Growth of epitaxial silicon at low temperatures using hot-wire chemical vapor deposition," Appl. Phys. Lett., vol. 75(7), pp. 992-994, 1999; Ohmi, T., Hashimoto, K., Morita, M., Shibata, T., "Study on further reducing the epitaxial silicon temperature down to 250° C. in low-energy bias sputtering," Journal of Appl. Phys., vol. 69(4), pp. 2062-2071, 1991).

With respect to low-temperature chemical vapor deposition (CVD) processes for deposition of the semiconductor layer, hot-wire CVD (Qi Wang, Charles W. Teplin, Paul Stradins, Bobby To, Kim M. Jones, and Howard M. Branz, "Significant improvement in silicon chemical vapor deposition epitaxy above the surface dehydrogenation temperature," J. of Appl. Phys., 100, 093520, 2006 and Charles W. Teplin, Qi Wang, Eugene Iwaniczko, Kim M. Jones, Mowafak Al-Jassim, Robert C. Reedy, Howard M. Branz, "Low-temperature silicon homoepitaxy by hot-wire chemical vapor deposition with a Ta filament," Journal of Crystal Growth 287 (2006) 414-418), plasma-assisted CVD ("Very Low Temperature Epitaxial Growth of Silicon Films for Solar Cells," Jap. J. of Appl. Phys. 46, 12, 7612-7618, 2007), ECR plasma CVD, mesoplasma CVD (Jose Mario A. Diaz, Munetaka Sawayanagi, Makoto Kambara, and Toyonobu Yoshida, "Electrical Properties of Thick Epitaxial Silicon Films Deposited at High Rates and Low Temperatures by Mesoplasma Chemical Vapor Deposition," Japanese Journal of Applied Physics, Vol. 46, No. 8A, 2007, pp. 5315-5317) and gas-jet plasma CVD (R. G. Sharafutdinov, V. M. Karsten, S. Ya. Khmel, A. G. Cherkov, A. K. Gutakovskii, L. D. Pokrovsky and O. I. Semenova, "Epitaxial silicon films deposited at high rates by gas-jet electron beam plasma CVD," Surface and Coatings Technology, Volumes 174-175, September-October 2003, Pages 1178-1181), electron-beam excited plasma CVD (Yagi, Y., Motegi, H., Ohshita, Y., Kojima, N., Yamaguchi, M., "High-speed growth of silicon thin films by EBEP-CVD using Si$_2$H$_6$," Photovoltaic Energy Conversion, 2003. Proceedings of 3rd World Conference on Volume 2, Issue, 12-16 May 2003 Page(s): 1667-1670 Vol. 2) are of interest.

Semiconductor layers can also be deposited using an ex-situ process. In this process, a precursor film of the semiconductor layer is first deposited followed by epitaxial crystallization of the semiconductor layer (see for example, International Patent Application No. WO 2004/033769 A1 titled "Fabrication method for crystalline semiconductor on foreign substrates"; Ngo Duong Sinh, Gudrun Andra, Fritz Falk, Ekkehart Ose, Joachim Bergmann, "Optimization of Layered Laser Crystallization for Thin-Film Crystalline Silicon Solar Cells," Solar Energy Materials & Solar Cells 74 (2002), 295-303; Nickel, N. H.; Brendel, K.; Saleh, R., "Laser crystallization of hydrogenated amorphous silicon," Physica status solidi. C. Conferences and critical reviews, vol. 1, no 5, pp. 1154-1168, 2004; J. B. Boyce, J. P. Lu, J. Ho, R. A. Street, K. van Schuylenbergh and Y. Wang, "Pulsed laser crystallization of amorphous silicon for polysilicon flat panel imagers," Journal of Non-Crystalline Solids, Vol. 299-302, pp. 731-735, 2002; Lulli, G.; Merli, P. G.; Antisari, M. Vittori, "Solid-phase epitaxy of amorphous silicon induced by electron irradiation at room temperature," Physical Review B (Condensed Matter), Volume 36, Issue 15, Nov. 15, 1987, pp. 8038-8042; Mohadjeri, B.; Linnros, J.; Svensson, B. G.; Östling, M., "Nickel-enhanced solid-phase epitaxial regrowth of amorphous silicon," Physical Review Letters, Volume 68, Issue 12, Mar. 23, 1992, pp. 1872-1875; Yann Civale, L is K. Nanver, Peter Hadley, Egbert J. G. Goudena, and Hugo Schellevis, "Sub-500° C. Solid-Phase Epitaxy of Ultra-Abrupt p+-Silicon Elevated Contacts and Diodes," IEEE Electron Device Letters, Vol. 27, 2006; Cline H. E., "A single crystal silicon thin-film formed by secondary recrystallization," Journal of Appl. Phys., vol. 55 (12), pp. 4392-4397, 1984; Santos, P. V.; Trampert, A.; Dondeo, F.; Comedi, D.; Zhu, H. J.; Ploog, K. H.; Zanatta, A. R.; Chambouleyron, I. "Epitaxial pulsed laser crystallization of amorphous germanium on GaAs," Journal of Applied Physics, Vol. 90, pp. 2575-2581, 2001; T. Sameshima, H. Watakabe, H. Kanno, T. Sadoh and M. Miyao, "Pulsed laser crystallization of silicon-germanium films," Thin Solid Films Vol. 487 pp. 67-71, 2005; R. D. Ott, P. Kadolkar, C. A. Blue, A. C. Cole, and G. B. Thompson, "The Pulse Thermal Processing of Nanocrystalline Silicon Thin-Films," JOM, vol. 56, pp. 45-47, October, 2004).

Solar cells based on polycrystalline $Cu(In, Ga)Se_2$ (GIGS) thin films are also of significant interest and a record efficiency of 19.2% has been demonstrated in laboratory scale. Scale-up of this process on flexible substrates continues in the industry, however, efficiencies obtained in production runs are much lower. Even the high efficiency solar cells made using the GIGS thin films are polycrystalline with an average grain size of about 2 μm. So far not much is completely established about the exact effect or influence of grain boundaries in GIGS solar cells. It has been proposed that oxygen may be passivating the otherwise detrimental grain boundaries (see for example, D. Cahen and R. Noufi, "Defect chemical explanation for the effect of air anneal on CdS/$CuInSe_2$ solar cell performance," Appl. Phys. Lett., vol. 54, pp. 558-560, 1989). It has also been suggested that the diffusion of sodium (Na) to the grain boundaries catalyzes this beneficial oxygenation (see for example, L. Kronik, D. Cahen, and H. W. Schock, "Effects of Sodium on Polycrystalline $Cu(In,Ga)Se_2$ and Its Solar Cell Performance," Advanced Materials, vol. 10, pp. 31-36, 1999). It has also been demonstrated that recombination charge carriers at grain boundaries is different from that of the bulk (see for example, M. J. Romero, K. Ramanathan, M. A. Contreras, M. M. Al-Jassim, R. Noufi, and P. Sheldon, "Cathodoluminescence of $Cu(In,Ga)Se_2$ thin films used in high-efficiency solar cells," Appl. Phys. Lett., vol. 83, pp. 4770-4772, 2003). It has been suggested that intrinsic passivation occurs at grain boundaries because of a wider gap at grain boundaries (see for example, Persson C, Zunger A., "Anomalous grain boundary physics in polycrystalline $CuInSe_2$: the existence of a hole barrier," Phys. Rev. Lett. vol. 91, pp. 266401-266406, 2003). It has been suggested that the beneficial local built-in potential at grain boundaries is dependent on the Ga content (see for example, C.-S. Jiang, R. Noufi, K. Ramanathan, J. A. AbuShama, H. R. Moutinho, and M. M. Al-Jassim, "Local Built-in Potential on Grain Boundary of $Cu(In,Ga)Se_2$ Thin Films," Conference Paper, NREL/CP-520-36981, 2005). It has been reported that there is a reduction in the Cu content at the grain boundaries and that this leads to the less detrimental effect of grain boundaries (see for example, M. J. Hetzer, Y. M. Strzhemechny, M. Gao, M. A. Contreras, A. Zunger, and L. J. Brillson, "Direct observation of copper depletion and potential changes at copper indium gallium diselenide grain boundaries," Appl. Phys. Lett. vol. 86, pp. 162105-162107, 2005). It has also been suggested that the crystallographic texture is also important for the higher efficiency CIGS based solar cells (see for example, S. Chaisitsak, A. Yamada and M. Konagai, "Preferred Orientation Control of $Cu(In1-xGax)Se_2$ (x≈0.28) Thin Films and Its Influence on Solar Cell Characteristics," Jpn. J. Appl. Phys. vol. 41, pp. 507-513, 2002). Taken together, these above studies suggest that while grain boundaries may not be very detrimental in general in CIGS-based solar cells, it is important what the composition of the grain boundary is so as to control its electronic activity. This requires very good control of grain boundary structure which is not possible in randomly or weakly uniaxially textured CIGS films. If the orientation of all the CIGS grains were controlled by fabricating crystallographically textured cells, then in run after run, the composition of the CIGS film grain boundaries will be the same. This will allow one to fabricate large-area CIGS-based cells with very high efficiencies in industrial settings which is not possible presently.

FIG. 23 shows variations in the metal or alloy substrate that can be used with this invention. FIG. 23A shows an idealized schematic representation in cross-section of a composite substrate which contains a crystallographically untextured or unaligned bottom with a top surface which is crystallographically textured or aligned such that the all the grains in this layer are aligned in all directions within 10 degrees. FIG. 23B shows an idealized schematic representation in cross-section of a composite substrate which contains a crystallographically untextured or unaligned center with a top and bottom surface which is crystallographically textured or aligned such that all the grains in this layer are aligned in all directions within 10 degrees.

Other applications of flexible electronics or circuits related to this invention are as connectors in various applications where flexibility, space savings, or production constraints limit the serviceability of rigid circuit boards or hand wiring. Another common application of flex circuits is in computer keyboard manufacturing; most keyboards made today use flexible circuits for the switch matrix.

Fabrication of a device layer or film in an epitaxial manner on a substrate is commonly performed in the electronic industry for many applications such as those involving superconductors, semiconductors, magnetic materials and electro-optical materials. In many of these applications, the performance of device layer can be significantly improved or enhanced via incorporation of an ordered array of nanodots, nanorods or nanoparticles second phase material. In other cases, incorporation of an ordered array of nanodots, nanorods or nanoparticles second phase material, can result in new and novel properties not possible otherwise. Also, in many of these applications, large-area and long device layers are required. This can be accomplished by epitaxial growth of device layers containing ordered array of nanodots, nanorods or nanoparticles second phase material on biaxially textured substrates. For example, in the field of high temperature superconductors, metallic tapes can be used to form epitaxial superconducting layers having long (km) lengths, for applications such as for low-loss electrical power lines, by epitaxial growth on artificially fabricated, biaxially textured substrates. Artificially fabricated, crystallographically textured substrates can be fabricated using thermomechanical texturing, by ion-beam assisted deposition or by inclined substrate deposition (the patents incorporated by reference as specified before teach how to fabricate such substrates).

In a preferred embodiment of the invention, self-assembled nanodots of a second phase material are incorporated during growth of the device layer. This can be done using many in-situ deposition techniques wherein the deposition of the film is done at elevated temperatures. In-situ film deposition techniques include pulsed laser ablation (PLD), chemical vapor deposition (CVD), molecular chemical vapor deposition (MOCVD), direct current (DC) or radio-frequency (rf) sputtering, electron beam co-evaporation, thermal co-evaporation and pulsed electron deposition (PED).

The self-assembled nanodots and/or nanorods of second phase material form due to misfit strain between the second phase and the matrix film. When the lattice parameter of the growing epitaxial film is different from that of the second phase material, a lattice mismatch occurs resulting in misfit strains. Nanodots and/or nanorods self-assemble themselves to minimize the strain and hence the energy of the composite film. Specific deposition conditions used during film growth as well as the composition or volume fraction of second phase incorporated, control the size, shape and orientation of the nanodots and/or nanorods. It is preferred to have a lattice mismatch between the film matrix and the material comprising the nanodots and/or nanorods to be greater than 3%. At this lattice mismatch and beyond, significant strains result and result in well-defined ordering of nanodots and nanorods.

Moreover, the ability to incorporate such self-assembled nanodots and/or nanorods of second phase material within a device layer while performing a single or simultaneous deposition is another important benefit of this invention. This significantly reduces the complexity of fabricating such novel device layers. Specific realization of this invention was demonstrated for a high temperature superconducting film of composition $YBa_2Cu_3O_x$ (YBCO) in which second phase nanodots and nanorods of composition $BaZrO_3$ (BZO) were incorporated during simultaneous deposition using PLD from a single target containing a mixture of YBCO and nanopowder of BZO.

EXAMPLE 23

Self-assembled nanodots and nanorods of non-superconducting phases were incorporated by performing laser ablation from a single target comprising a mixture of YBCO powder and nanoparticles of the chosen non-superconducting phase. Nanoparticles of materials such as BZO, $CaZrO_3$ (CZO), YSZ, $Ba_xSr_{1-x}TiO_3$ (BST), etc. are commercially available from vendors such as Sigma-Aldrich. These nanoparticles, with a sharp particle size distribution ranging from 10-100 nm, are well-mixed with YBCO powder, via mechanical mixing, then cold pressed to form a green target. The target was then sintered at 950° C. in flowing oxygen. The target is then mounted on the target holder in the pulsed laser deposition (PLD) experimental setup. Depositions were performed on the technically important rolling-assisted-biaxially-textured-substrates (RABiTS) substrates with the configuration Ni-5 at % W (50 μM)/$Y_2O_3$ (75 nm)/YSZ (75 nm)/$CeO_2$ (75 nm). PLD depositions were performed using a XeCl (308 nm) excimer laser, LPX 305 at a repetition rate of 10 Hz, substrate deposition temperature of 790° C. and an oxygen partial pressure of 120 mTorr.

Figure 24:
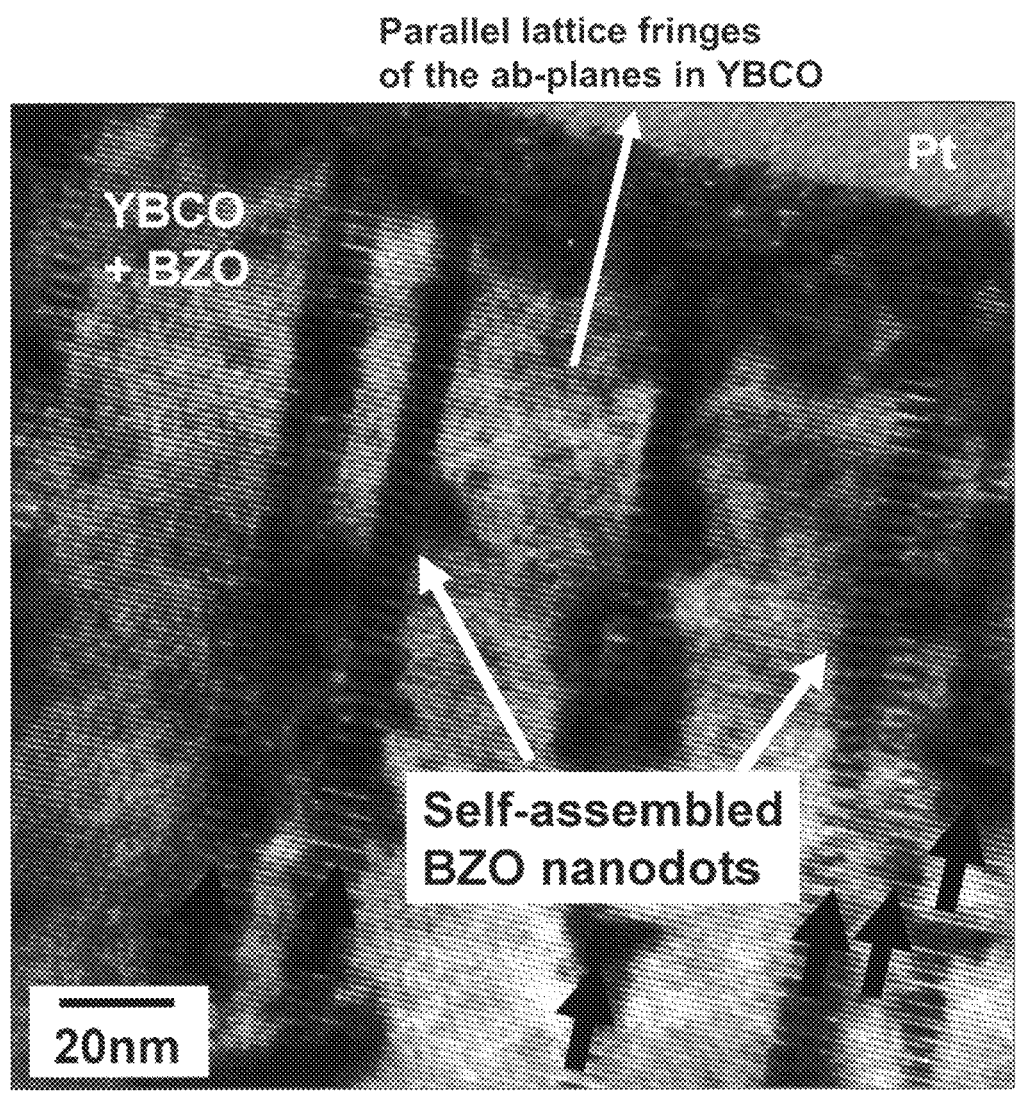
FIG. 24 shows a cross-section, transmission electron microscopy (TEM) image of a 0.2 μm thick, $YBa_2Cu_3O_x$, (YBCO) layer with self-assembled nanodots of BZO, grown epitaxially on a biaxially textured substrate with epitaxial buffers. Columns of self-assembled nanodots of $BaZrO_3$ (BZO) can be seen within the YBCO layer. The columns are perpendicular to the ab-planes of YBCO which are represented by the parallel lattice fringes in the YBCO layer, and are parallel to the c-axis of YBCO. Black arrows in the figure show the location of some of the columns of self-assembled nanodots of BZO.
Figure 25:
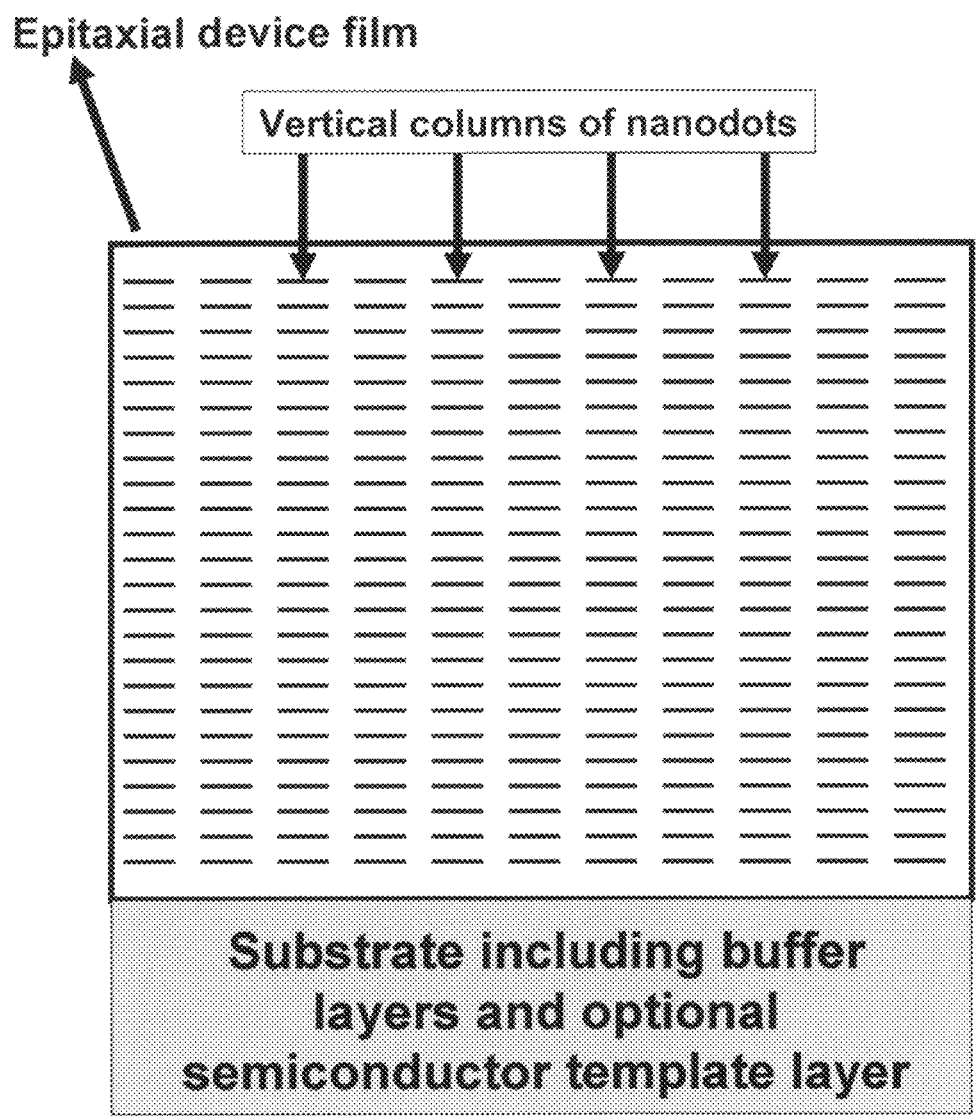
FIG. 25 shows an idealized schematic representation in cross-section of self-assembled or ordered nanodots within a device layer grown epitaxially on a substrate. In this case the ordering of nanodots occurs such that vertical columns of nanodots are formed.
Figure 26:
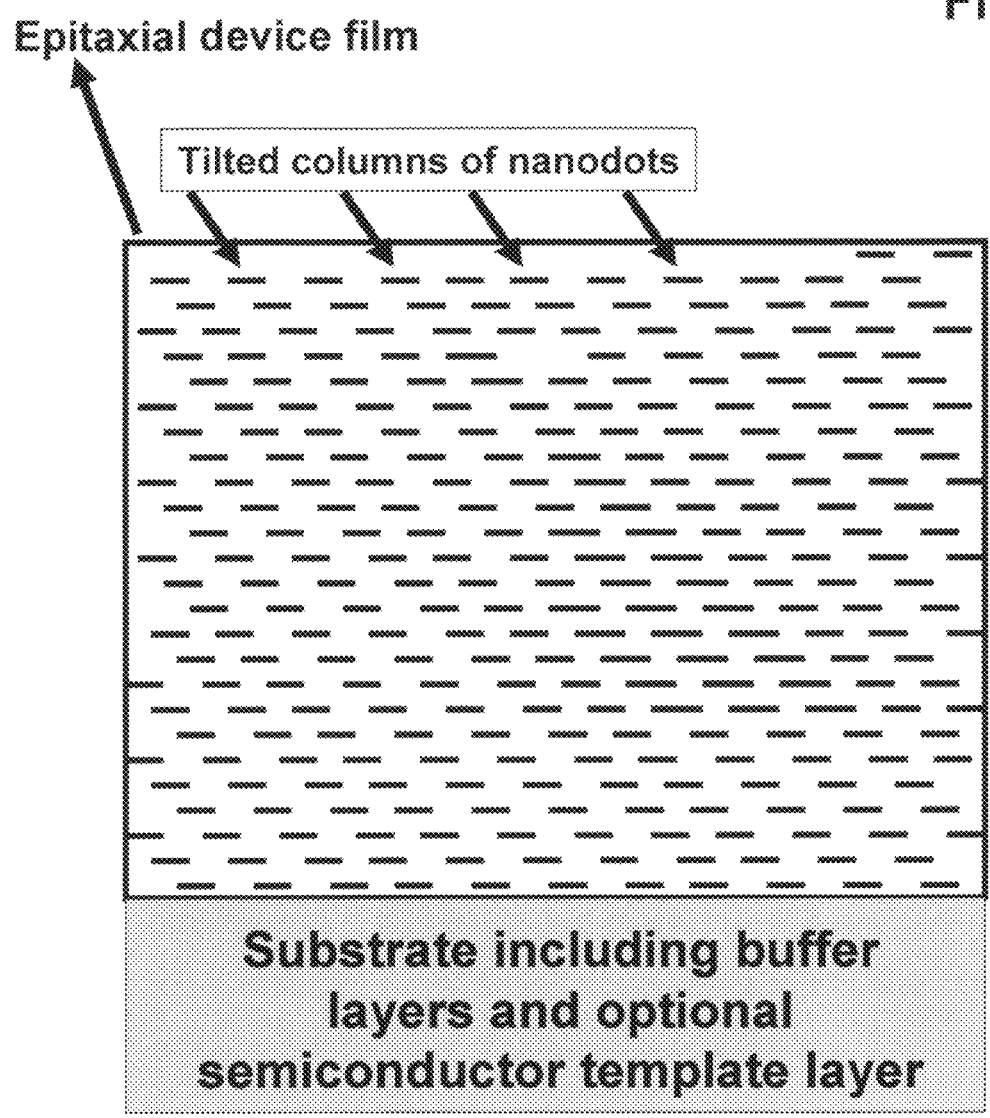
FIG. 26 shows an idealized schematic representation in cross-section of self-assembled or ordered nanodots within a device layer grown epitaxially on a substrate. In this case the ordering of nanodots can occur in a manner so as to form tilted columns of nanodots.
Figure 27:
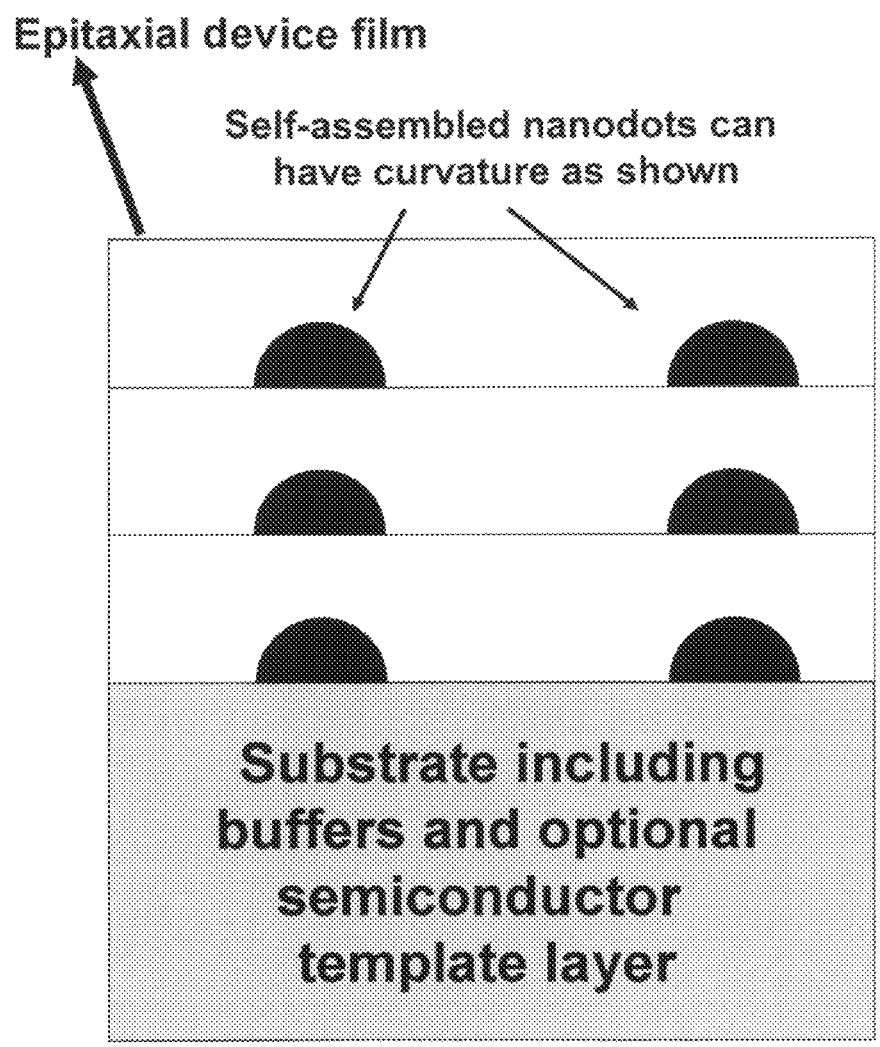
FIG. 27 shows an idealized schematic representation of self-assembled or ordered nanodots within a device layer grown epitaxially on a substrate. In this case the ordering of nanodots is vertical, however the nanodots have a curvature to them as shown.

The PLD target was prepared by mechanically mixing pre-formed YBCO micron-sized powder with commercial BZO nanopowder, followed by cold pressing and sintering to form a target. Films were grown on a single crystal-like, biaxially textured substrate fabricated by thermomechanical processing and of composition Ni-3 at % W or Ni-5 at % W. Prior to the growth of the composite device layer, epitaxial multi-layers of buffer layers of $Y_2O_3$, yttria stabilized zirconia (YSZ) and $CeO_2$ were deposited on the metallic alloy substrate. The substrates were mounted on a heater block and the assembly was heated to a predetermined deposition temperature. The optimal temperature of film growth was determined by routine experimentation. The optimal distance between the target used for PLD and the substrate on which the film was deposited was also determined via routine experimentation. The background gas pressure used during the deposition so as to be in a regime wherein both the YBCO and BZO are stable was also determined by routine experimentation. FIG. 24 shows a cross-section, transmission electron microscopy (TEM) image of a 0.2 μm thick, $YBa_2Cu_3O_x$ (YBCO) layer with self-assembled nanodots of BZO, grown epitaxially on a biaxially textured substrate with epitaxial buffers. Columns of self-assembled nanodots of $BaZrO_3$ (BZO) can be seen within the YBCO layer. The columns are perpendicular to the ab-planes of YBCO which are represented by the parallel lattice fringes in the YBCO layer, and are parallel to the c-axis of YBCO. Black arrows in the figure show the location of some of the columns of self-assembled nanodots of BZO. FIG. 25 shows schematic of a cross-section of this desired structure in a more general manner. Shown in the figure is an epitaxial device film on a crystallographically textured substrate containing self-assembled nanodots of a second phase material. In this case, all the columns of self assembled nanodots are well aligned in a direction perpendicular to the substrate. FIG. 26 shows schematic of an epitaxial device film on a crystallographically textured substrate containing self-assembled nanodots of a second phase material wherein the columns of self assembled nanodots are well tilted with respect to the direction perpendicular to the substrate. FIG. 27 shows schematic of an epitaxial device film on a crystallographically textured substrate containing self-assembled nanodots of a second phase material wherein the self assembled nanodots are not flat but curved. Combination of the effects shown in FIGS. 25, 26 and 27 can also occur during film growth.

Since the present invention results in crystallographically textured or single-crystal-like devices, their performance is excellent. However, the present invention also results in cheaper devices. For example, in a typical production cost breakdown for crystalline silicon solar cell modules the slicing of the Si substrate, cell processing and module assembly accounts for 70% of the total cost of the module. Using the present invention to make solar cells, no slicing and module assembly is required. Module assembly involving assembling a number of processed si wafers into a module, alone accounts for 35% of the total cost of the solar cell module. In the present invention, very large-area, textured solar cells can be fabricated using continuous or static processes. The device can then be patterned appropriately to delineate various cells in the large-area module.

The electronic device in accordance with this invention can be used for an application selected from a group comprising of photovoltaic devices, flat-panel displays, thermophotovoltaic devices, ferroelectric devices, light emitting diode devices, computer hard disc drive devices, magnetoresistance based devices, photoluminescence based devices, non-volatile memory devices, dielectric devices, thermoelectric devices and quantum dot laser devices. In a preferred embodiment, the electronic device has an area larger than 50 in$^2$. In yet a further preferred embodiment, the electronic device has an area larger than 113 in$^2$. Electronic devices in accordance with this invention can comprise at least one device component selected from a group comprising of two terminal devices such as a diode; three terminal devices such as a transistor, thyristor or rectifier; and multi-terminal devices such as a microprocessor, random access memory, read-only-memory or a charge-coupled device.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

I claim:

1. A flexible, polycrystalline, electronic device article comprising;
   a. a large-grained, polycrystalline, annealed metal or alloy substrate with a primary or secondary recrystallization texture corresponding to {100}<100>, with a mosaic of less than 10 degrees;
   b. at least one polycrystalline, buffer layer on said substrate selected from a group consisting of a metal, an alloy, a nitride, boride, oxide, fluoride, carbide, silicide, intermetallic alloy with germanium or combinations thereof, having a crystallographic texture corresponding to a single {100}<100> or a 45°-rotated {100}<100> texture;
   c. at least one epitaxial, polycrystalline, semiconductor device layer on said buffer layer having a crystallographic texture corresponding to a single orientation, {100}<100> or a 45°-rotated {100}<100> texture.

2. The article of claim 1 wherein said semiconductor device layer is a binary, ternary or a quarternary compound semiconductor, composed of elements from two or more different groups of the Periodic Table.

3. The article of claim 1, wherein said semiconductor device layer corresponds to an elemental semiconductor or alloys of elements within the same group or a compound semiconductor comprising elements of group IB, IIIA and VIA of the periodic table.

4. The article of claim 1 wherein said substrate has an average grain size larger than 100 microns.

5. The article of claim 1 wherein said substrate has a rotated {100}<100> texture, with a rotation angle of less than 45°.

6. The article of claim 1 wherein the out-of-plane texture of said substrate is characterized by a mosaic or FWHM of less than 5°.

7. The article of claim 1 wherein said buffer layer has a crystal structure selected from a group consisting of rock-salt crystal structures of formula AN or AO, where A is a metal and N and O correspond to nitrogen and oxygen; perovskite crystal structures of formula $ABO_3$, where A and B are metals and O is oxygen; pyrochlore crystal structures of formula $A_2B_2O_7$, where A and B are metals and O is oxygen and bixbyite crystal structures of formula $A_2O_3$, where A is a metal and O is oxygen.

8. The article of claim 1 wherein said buffer layer has a chemical formula selected from a group consisting of a mixed rock-salt crystal structures with the formula of $A_xB_{1-x}O$ and $A_xB_{1-x}N$, where A and B are different metals; mixed oxynitrides with the formula of $A_xB_{1-x}N_yO_{1-y}$, where A and B are different metals; mixed bixbyite structures with the formula of $(A_xB_{1-x})_2O_3$, where A and B are different metals; mixed perovskites with the formula of $(A_xA'_{1-x})BO_3$, $(A_xA'_{1-x})(B_yB'_{1-y})O_3$, where A, A', B and B' are different metals and mixed pyrochlores with the formula of $(A_xA'_{1-x})_2B_2O_7$, $(A_xA'_{1-x})_2(B_yB'_{1-y})_2O_7$, where A, A', B and B' are different metals.

9. The article of claim 1 wherein said oxide buffer layer is selected from a group consisting of gamma $Al_2O_3$ (cubic form of $Al_2O_3$), $SrTiO_3$, $(Sr,Nb)TiO_3$, $BaTiO_3$, $(Ba,Ca)TiO_3$, $LaMnO_3$, $LaAlO_3$, $(La,Sr)MnO_3$, $(La,Ca)MnO_3$, $Bi_4Ti_3O_{12}$, $La_2Zr_2O_7$, $Ca_2Zr_2O_7$, $Gd_2Zr_2O_7$, $Y_2O_3$, YSZ, MgO and $MgAl_2O_4$.

10. The article of claim 1 wherein said silicide buffer layer or an intermetallic alloy with germanium corresponds to a layer with a chemical formula, MSi, $MSi_2$, $MSi_3$, MGe, $MGe_2$ or $MGe_3$, wherein M is a metal selected from Ni, Cu, Fe, Ir, and Co, and their alloys and mixtures thereof.

11. The article of claim 1 wherein said carbide buffer layer corresponds to the cubic form of SiC.

12. The article of claim 1 wherein said buffer layer is a "compositionally graded buffer layer" comprising of multiple buffer layers with varying lattice parameters to provide a good lattice match to the semiconductor device layer.

13. The article of claim 1 wherein said at least one buffer layer is electrically conducting.

14. The article of claim 1 further comprising a semiconductor template layer on top of the buffer layer to provide a good lattice match to the semiconductor device layer.

15. The article of claim 14 wherein the semiconductor template layer is a "compositionally graded semiconductor template" layer with multiple layers of varying lattice parameters so as to provide a good lattice match to the semiconductor device layer.

16. The article of claim 1 wherein said substrate is selected from a group consisting of Cu, Ni, Al, Mo, Nb and Fe and their alloys thereof.

17. The article of claim 1 wherein said buffer layer is selected from buffer-layer configurations consisting of a cubic nitride layer, a multilayer of MgO/cubic nitride, a multilayer of $Y_2O_3$/YSZ/cubic nitride, a multilayer of $Y_2O_3$/YSZ/MgO/cubic nitride, a cubic oxide layer, a multilayer of MgO/cubic oxide, a multilayer of $Y_2O_3$/YSZ/cubic oxide and a multilayer of $Y_2O_3$/YSZ/MgO/cubic oxide.

18. The article of claim 17 wherein said cubic nitride layer is TiN.

19. The article of claim 17 wherein said cubic oxide layer is $\gamma$-$Al_2O_3$.

20. The article of claim 17 further comprising a semiconductor template layer on top of the buffer layer, wherein said cubic nitride is a compositionally graded nitride layer to provide a good lattice match to the semiconductor device layer or semiconductor template layer.

21. The article of claim 17 further comprising a semiconductor template layer on top of the buffer layer, wherein said cubic oxide is a compositionally graded oxide layer to provide a good lattice match to the semiconductor device layer or semiconductor template layer.

22. The article of claim 1 wherein the at least one buffer layer is polycrystalline and crystallographically unaligned and is a result of a reaction between two adjacent layers in the device.

23. The article of claim 1 wherein said metal or alloy substrate is a multilayer composite substrate with only the top surface having a crystallographic texture corresponding to {100}<100> with a mosaic of less than 10°.

24. The article of claim 1 wherein said metal or alloy substrate is a multilayer composite substrate with only the top and bottom layers having a crystallographic texture corresponding to {100}<100> with a mosaic of less than 10°.

25. The article of claim 1 wherein at least a portion of said substrate comprises a Ni-based alloy with a W content of 3-9 atomic percent.

26. The article of claim 1 wherein said electronic device is selected from a group consisting of photovoltaic devices, flat-panel displays, thermophotovoltaic devices, ferroelectric devices, light emitting diode devices, computer hard disc drive devices, magnetoresistance based devices, photoluminescence based devices, non-volatile memory devices, dielectric devices, thermoelectric devices and quantum dot laser devices.

27. The article of claim 1 wherein said electronic device comprises at least one device selected from a group consisting of two terminal devices, three terminal devices, and multi-terminal devices.

28. The article of claim 1 wherein said electronic device forms a component of a flat-panel active-matrix liquid crystal display (AMLCD) or a flat-panel active-matrix organic light-emitting diode (AMOLED) display.

29. The article of claim 1 wherein said electronic device is a photovoltaic device comprising at least one pn junction parallel to the substrate surface.

30. The article of claim 29 wherein the photovoltaic device comprises a multi-junction cell with at least two and preferably three pn junctions parallel to the substrate surface.

31. The article of claim 29 wherein the conversion efficiency of said device is greater than 13%.

32. The article of claim 29 wherein the conversion efficiency of said device is greater than 15%.

33. The article of claim 1 wherein said semiconductor device layer consists of aligned nanodots of another crystalline composition than the device layer, with the diameter of nanodots being in the range of 2-100 nanometers.

34. The article of claim 33 wherein 80% of the nanodots are aligned within 60 degrees from the normal to the device layer.

35. The article of claim 1, wherein said semiconductor device layer is selected from the group consisting of Si, Ge, GaP, GaN, GaAs, CdTe, InP, InAs, InSb, ZnS, ZnSe, ZnTe, CdTe, HgTe, $Si_xGe_{1-x}$, CdHgTe, $CuInGaSe_2$ (CIGS), AlGaAs, GaInP, InGaN, AlInGaP, AlInP, $Zn_{1-y}Mn_yO_xTe_{1-x}$ and $GaN_xAs_{1-x-y}P_y$.

36. The article of claim 1 wherein said buffer layer has a crystal structure selected from the group consisting of flourite, perovskite, rock-salt, pyrochlore and spinel crystal structures.

37. The article of claim 1 wherein said electronic device is selected from a group consisting of a diode, transistor, thyristor, rectifier, microprocessor, random access memory and a charge coupled device.

38. The article of claim 1 wherein the grain size distribution and grain structure or grain morphologies in said polycrystalline metal or alloy substrate are substantially replicated in the polycrystalline buffer layer.

39. The article of claim 1 wherein the grain size distribution and grain structure or grain morphologies in said polycrystalline metal or alloy substrate are substantially replicated in the polycrystalline semiconductor device layer.

* * * * *